US006657878B2

(12) United States Patent
Lien et al.

(10) Patent No.: US 6,657,878 B2
(45) Date of Patent: Dec. 2, 2003

(54) CONTENT ADDRESSABLE MEMORY (CAM) DEVICES HAVING RELIABLE COLUMN REDUNDANCY CHARACTERISTICS AND METHODS OF OPERATING SAME

(75) Inventors: Chuen-Der Lien, Los Altos Hills, CA (US); Chau-Chin Wu, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 37 days.

(21) Appl. No.: 10/084,842

(22) Filed: Feb. 27, 2002

(65) Prior Publication Data

US 2003/0165073 A1 Sep. 4, 2003

(51) Int. Cl.[7] ............................................. G11C 15/00
(52) U.S. Cl. ....................................... 365/49; 365/225.7
(58) Field of Search ......................... 365/49, 202, 200, 365/203, 210, 225.7, 228

(56) References Cited

U.S. PATENT DOCUMENTS

| | | | |
|---|---|---|---|
| 5,319,589 A | * | 6/1994 | Yamagata et al. ............ 365/49 |
| 5,319,590 A | | 6/1994 | Montoye |
| 5,532,966 A | | 7/1996 | Poteet et al. |
| 5,706,224 A | | 1/1998 | Srinivasan et al. |
| 5,852,569 A | | 12/1998 | Srinivasan et al. |
| 5,964,857 A | | 10/1999 | Srinivasan et al. |
| 6,092,223 A | | 7/2000 | Ahn |
| 6,101,116 A | | 8/2000 | Lien et al. |
| 6,118,712 A | | 9/2000 | Park et al. |
| 6,128,207 A | | 10/2000 | Lien et al. |
| 6,157,558 A | * | 12/2000 | Wong ........................... 365/49 |
| 6,157,582 A | | 12/2000 | Rezeanu |
| 6,219,285 B1 | | 4/2001 | Murakuki et al. |
| 6,256,216 B1 | | 7/2001 | Lien et al. |
| 6,262,907 B1 | | 7/2001 | Lien et al. |
| 6,275,426 B1 | | 8/2001 | Srinivasan et al. |
| 6,307,417 B1 | | 10/2001 | Proebsting |
| 6,343,037 B1 | | 1/2002 | Park et al. |
| 6,370,052 B1 | | 4/2002 | Hsu et al. |

OTHER PUBLICATIONS

U.S. application No. 10/004,456, filed Oct. 19, 2001.
U.S. application No. 09/617,155, filed Jul. 17, 2000.

* cited by examiner

Primary Examiner—Thong Le
(74) Attorney, Agent, or Firm—Myers Bigel Sibley & Sajovec

(57) ABSTRACT

Content addressable memory (CAM) devices provide improved reliability by inhibiting disabled CAM cells within defective (or unused redundant columns) from contributing to either sustained or intermittent look-up errors when the CAM device is operated in an intended application. The improved reliability may be achieved in volatile CAM devices by configuring (e.g., programming) each column driver that is associated with a CAM array having a defective column therein to preserve intentionally written data and/or mask values of the disabled CAM cells across repeated power reset events.

48 Claims, 15 Drawing Sheets

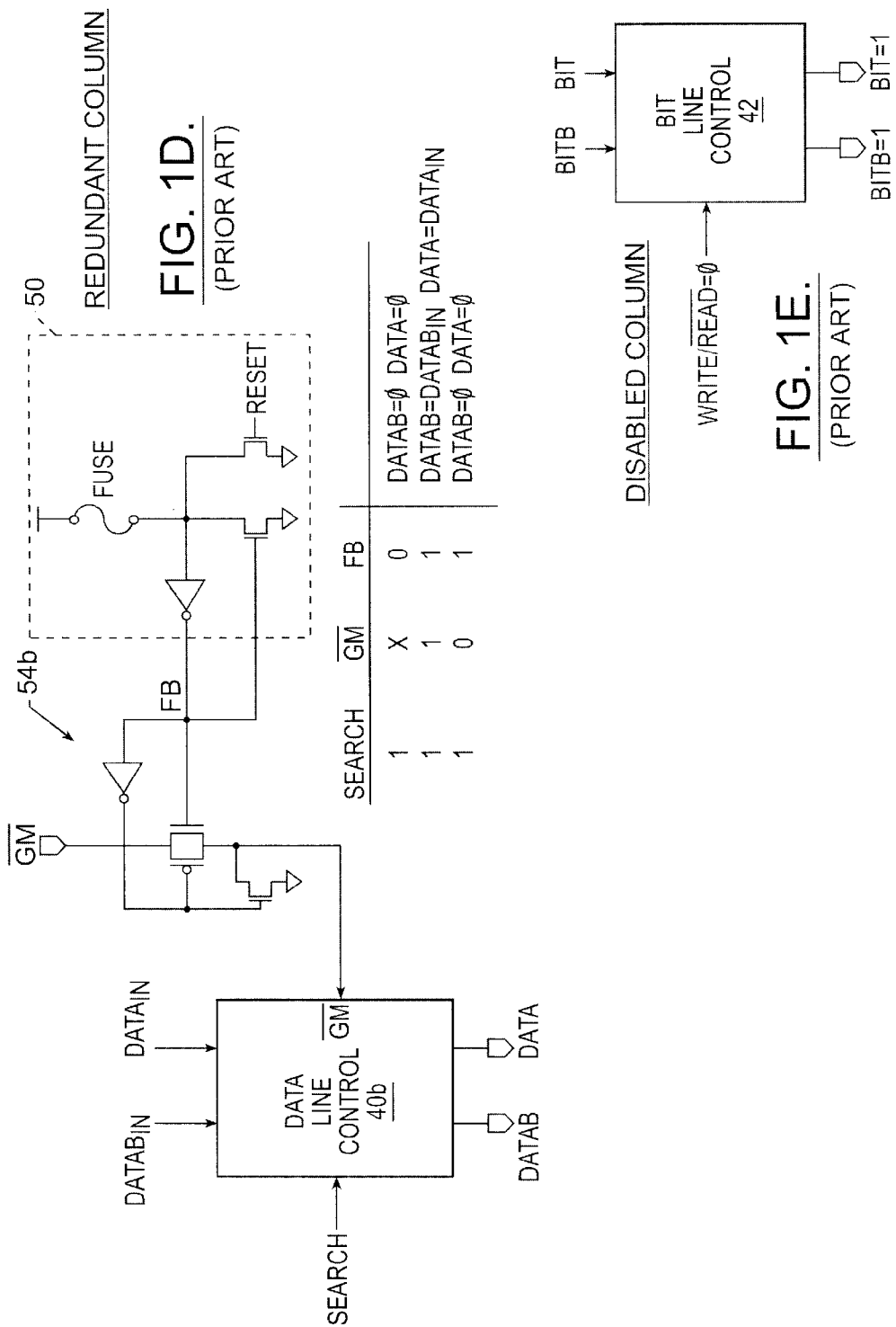

| APPLIED SEARCH WORD | 0 | 1 | 1 | 0 | 1 | 0 | 1 | 1 | 1 | 0 | 0 | 1 | 0 | 1 |
|---|---|---|---|---|---|---|---|---|---|---|---|---|---|---|

CAM ARRAY (14x14)

MASK

| COLUMN | 1 | 2 | 3 | 4 | 5 | 6 | 7 | 8 | 9 | 10 | 11 | 12 | 13 | 14 | R |
|---|---|---|---|---|---|---|---|---|---|---|---|---|---|---|---|
| 1 | 0 | 1 | 1 | 0 | 1 | 0 | 0 | 0 | 0 | 1 | 1 | 0 | 0 | 0 | 0 |
| 2 | 1 | 1 | 1 | 0 | 0 | 0 | 0 | 0 | 0 | 0 | 0 | 1 | 1 | 1 | 1 |
| 3 | 0 | 1 | 1 | 1 | 0 | 0 | 0 | 0 | 0 | 1 | 0 | 0 | 0 | 1 | |
| 4 | 0 | 0 | 1 | 1 | 0 | 1 | 0 | 1 | 1 | 1 | 0 | 0 | 1 | 0 | 0 |
| 5 | 0 | 0 | 0 | 0 | 1 | 1 | 0 | 0 | 0 | 1 | 1 | 1 | 1 | 1 | 0 |
| 6 | 1 | 0 | 1 | 0 | 1 | 0 | 0 | 1 | 0 | 1 | 0 | 1 | 0 | 1 | 0 |
| 7 | 0 | 1 | 1 | 0 | 1 | 0 | 0 | 1 | 1 | 1 | 0 | 0 | 1 | 0 | 1 |
| 8 | 1 | 1 | 1 | 1 | 0 | 1 | 0 | 1 | 1 | 0 | 0 | 1 | 1 | 1 | |
| 9 | 0 | 0 | 0 | 0 | 0 | 1 | 0 | 1 | 0 | 0 | 0 | 0 | 1 | 0 | 0 |
| 10 | 0 | 0 | 0 | 1 | 1 | 1 | 0 | 0 | 0 | 0 | 0 | 0 | 0 | 0 | 1 |
| 11 | 1 | 0 | 1 | 1 | 0 | 1 | 0 | 1 | 1 | 0 | 1 | 1 | 1 | 1 | 0 |
| 12 | INVALID/EMPTY | | | | | | | | | | | | | | |
| 13 | INVALID/EMPTY | | | | | | | | | | | | | | |
| 14 | INVALID/EMPTY | | | | | | | | | | | | | | |

ROW (36)

FIG. 6.

CONTENT ADDRESSABLE MEMORY (CAM) DEVICES HAVING RELIABLE COLUMN REDUNDANCY CHARACTERISTICS AND METHODS OF OPERATING SAME

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a compare operation to identify one or more locations within the array that contain data equivalent to the applied data and thereby represent a "match" condition. In this manner, data is accessed according to its content rather than its address. Upon completion of the compare operation, the identified location(s) containing equivalent data is typically encoded to provide an address at which the equivalent data is located. If multiple locations are identified in response to the compare operation, then priority encoding operations may be performed to identify a best or highest priority match. Such priority encoding operations frequently utilize the physical locations of multiple matches within the CAM array to identify a highest priority match. Exemplary CAM cells and CAM memory devices are more fully described in U.S. Pat. Nos. 5,706,224, 5,852,569 and 5,964,857 to Srinivasan et al. and U.S. Pat. Nos. 6,101,116, 6,256,216 and 6,128,207 to Lien et al., assigned to the present assignee, the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, ..., {1XXX}, {XXXX}.

Operations to perform a conventional compare operation will now be described more fully with respect to FIG. 1A. In particular, FIG. 1A illustrates a conventional ten transistor (10T) CAM cell 10. The CAM cell 10 includes an SRAM data cell and a compare circuit. The SRAM data cell includes first and second access transistors N1 and N2 and first and second inverters that are electrically coupled in antiparallel. The true and complementary inputs of the SRAM data cell are electrically coupled to a true bit line BIT and a complementary bit line BITB, respectively. The true and complementary outputs of the SRAM data cell are illustrated as nodes Q and QB, respectively. The compare circuit includes transistors N3–N6, with the gate of transistor N6 operating as a true data input of the compare circuit and the gate of transistor N4 operating as a complementary data input of the compare circuit. As illustrated, the true data input of the compare circuit is electrically connected to the true data line DATA and the complementary data input of the compare circuit is electrically connected to the complementary data line DATAB. As illustrated by the dofted lines, the true bit line BIT and the complementary data line DATAB may be electrically connected together as a first bit line and the complementary bit line BITB and the true data line DATA may be electrically connected together as a second bit line. The first and second bit lines may be treated as a pair of differential bit/data lines that support rail-to-rail (e.g., Vdd-to-Vss) signals.

The compare circuit is also electrically connected to a pair of signal lines. This pair of signal lines includes a match line and a pseudo-ground line (PGND) or ground line (Vss). The pseudo-ground line PGND is frequently referred to as a "low" match line (LM). The operation of a CAM cell that is responsive to a match line and pseudo-ground line PGND is more fully described in U.S. Pat. No. 6,262,907 to Lien et al., entitled "Ternary CAM Cell," assigned to the present assignee, the disclosure of which is hereby incorporated herein by reference. The match line and pseudo-ground line PGND are precharged high prior to a compare operation and then the pseudo-ground line PGND is pulled low at a commencement of the compare operation. During the compare operation, the potential of the match line can be monitored to determine whether or not the CAM cell 10 is associated with a matching entry within a CAM array. For example, if the SRAM data cell within the CAM cell 10 is storing a logic 1 value (Q=1 and QB=0) and the illustrated pair of data lines is driven with a matching logic 1 value (i.e., DATA=1 and DATAB=0), then transistors N3 and N6 within the compare circuit will be turned on and transistors N4 and N5 within the compare circuit will remain off. Under these conditions, the series electrical connection provided by transistors N3 and N4 and the series electrical connection provided by transistors N5 and N6 will both remain nonconductive. Accordingly, the CAM cell 10 will not operate to electrically connect (i.e., "short") the match line and pseudo-ground line PGND together and, therefore, will not operate to pull-down the match line from its precharged high level. In contrast, if the SRAM cell within the CAM cell 10 is storing a logic 0 value (Q=1 and QB=0) and the illustrated pair of data lines is driven with an logic 1 value (i.e., DATA=1 and DATAB=0), then transistors N5 and N6 within the compare circuit will be turned on and transistors N3 and N4 within the compare circuit will remain off. Under these conditions, the series electrical connection provided by transistors N5 and N6 will become conductive and the match line will be pulled-down from its precharged high level.

Referring now to FIG. 2, a conventional nine transistor (9T) CAM cell 12 is illustrated. This CAM cell 12 includes an SRAM data cell and a compare circuit. The compare circuit includes three transistors N7–N9. When the SRAM data cell is storing a logic 1 value (i.e., Q=1 and QB=0), and the pair of differential data lines are driven with a logic 1 value (i.e., DATA=1 and DATAB=0), transistors N7 and N8 will remain off and node N will remain low at its precharged low level. Under these conditions, transistor N9 will remain nonconductive and the CAM cell 12 will not operate to pull the match line low from its precharged high level. In contrast, if the SRAM data cell is storing a logic 0 value (i.e., Q=0 and QB=1), and the pair of differential data lines are driven with a logic 1 value (i.e., DATA=1 and DATAB=0), transistor N7 will remain off, but transistor N8 will turn on and drive node N high from its precharged low level. Under these conditions, transistor N9 will turn on and the CAM cell 12 will pull the match line low from its precharged high level, thereby indicating a "miss" condition (i.e., a mismatch between the data stored in the SRAM data cell and the data bit applied to the pair of data lines).

The CAM cell 14 of FIG. 3 includes an SRAM data cell, which is identical to the SRAM data cell of FIG. 1, and a SRAM mask cell. The SRAM mask cell includes access transistors N11 and N12 and a pair of inverters that are electrically connected in antiparallel. The differential outputs of the SRAM mask cell are illustrated as nodes M and MB. The gates of access transistors N11 and N12 are electrically connected to a respective mask line, which operates as a "word" line during operations to write data to and read data from the SRAM mask cell. By convention, the CAM cell 14 of FIG. 3 has three states: 1, 0 and X (don't care). The X state is achieved by setting the true output node M of the SRAM mask cell to a logic 0 value. When the true output node M of the SRAM mask cell is set to a logic 0 value, transistor N10 within the compare circuit will remain off and preclude the match line and pseudo-ground line PGND from being connected together during a compare operation. Accordingly, setting the true output node M of the SRAM mask cell to a logic 0 value operates to actively mask the CAM cell 14 during a compare operation and thereby prevents the CAM cell 14 from indicating a cell miss condition by pulling down the match line from its precharged high level. However, when the true output node M of the SRAM mask cell is set to a logic 1 value, the CAM cell 14 is not actively masked and the compare circuit operates in a similar manner to the compare circuit illustrated by FIG. 1.

The CAM cell 16 illustrated by FIG. 4 is similar to the CAM cell 12 of FIG. 2, however, an additional SRAM mask cell is provided and the compare circuit is modified to include an additional transistor N13. The SRAM mask cell of FIG. 4 is identical to the SRAM mask cell of FIG. 3. As will be understood by those skilled in the art, setting the true output M of the SRAM mask cell to a logic 1 value will cause the transistor N13 within the compare circuit to become conductive. When the transistor N13 becomes conductive, the mask associated with the CAM cell 16 is inactive and the compare circuit of FIG. 4 operates identically to the compare circuit of FIG. 2.

Referring now to FIG. 1B, a block diagram of a partially full CAM array 18 undergoing a search operation is provided. Using conventional techniques, the match lines associated with invalid entries in the CAM array 18 may be disabled. The CAM array 18 of FIG. 1B may utilize one or more of the CAM cells described above with respect to FIGS. 1A and 2–4. The CAM array 18 is illustrated as having a maximum depth of 14 rows, with each row supporting an entry having a width of 14 bits. To improve manufacturing yield, the CAM array 18 is also illustrated as including an active redundant column of CAM cells, shown as column R, which replaces a defective normal column, shown as column 7.

Conventional circuitry to enable replacement of a defective column with a redundant column is illustrated by FIGS. 1C–1E. In particular, FIG. 1C illustrates a data line control circuit 40a and a fuse-programmable circuit 50 that enables the data line control circuit 40a when the illustrated fuse is not blown (FB=0) and disables the data line control circuit 40a when the fuse is blown or cut (FB=1) in response to yield testing. The elements of FIG. 1C are typically used to drive a main column of a CAM array. As illustrated by the global mask pass-through circuit 50a, an active low global mask signal (/GM) is provided to the data line control circuit 40a when FB=0. However, once the fuse is blown (and a reset pulse RESET is received), the pass-through circuit 54a operates to clamp the global mask input of the data line control circuit 40a at a logic 0 level, thereby masking the outputs DATA and DATAB in accordance with the illustrated truth table. FIG. 1D illustrates a data line control circuit 40b and a fuse-programmable circuit 50 that disables the data line control circuit 40b when the illustrated fuse is not blown (FB=0), which is the default condition upon manufacture, and enables the data line control circuit 40b when the fuse is blown or cut (FB=1). The elements of FIG. 1D are typically used to drive a redundant column of a CAM array. As illustrated by the global mask pass-through circuit 54b, an active low global mask signal (/GM) is provided to the data line control circuit 40b when FB=1. However, if the fuse is not blown, the pass-through circuit 54b operates to clamp the global mask input of the data line control circuit 40b at a logic 0 level, thereby masking the outputs DATA and DATAB in accordance with the illustrated truth table. Referring now to FIG. 1E, a conventional bit line control circuit 42 is illustrated. The conventional bit line control circuit 42 typically drives respective pairs of differential bit lines BIT and BITB at levels consistent with a conventional read operation (i.e., BIT=BITB=1) by clamping a write control input of the bit line control circuit 42 at a logic 0 level, in response to a blown fuse (i.e., FB=1).

During a search operation on the CAM array 18 of FIG. 1B, also referred to herein as a "look-up" or "compare" operation, an applied search word having a width of 14 bits is driven onto 14 pairs of complementary comparand data lines (e.g., DATA/DATAB) that span respective active columns of the CAM array 18. In particular, the search word is applied to columns 1–6, 8–14 and R of the CAM array 18, while the defective column 7, which has been disabled by a bit line control circuit (not shown), receives a mask value (i.e., $DATA_7=DATAB_7=0$). Based on the illustrated masking of column 7, only row 7 of the CAM array 18 will generate a match condition in response to the search operation.

As will be understood by those skilled in the art, a defective column of a CAM array can be masked during a search operation by pulling and holding both data lines low (i.e., DATA=0 and DATAB=0). Pulling and holding both data lines low operates to disable the compare circuit associated with each CAM cell within the defective column. Thus, in the illustrated example, defective column 7 of the CAM array 18 is masked during each search operation. Because column 7 is masked during each search operation, it has not been necessary for control circuitry associated with the CAM array 18 to intentionally write the data values of the CAM cells in the defective column, because none of the data values within a defective column will be compared with any valid bit of an applied search word. Typically, the data values of the CAM cells in a defective column achieve random or arbitrary states (shown as ?) when the CAM array 18 is powered-up for a first time and one or more of these states may switch every time the CAM array 18 undergoes a power reset event.

Notwithstanding the use of redundant columns to improve yield in manufactured CAM devices, there continues to be a need for CAM devices having excellent yield and increased reliability when used in an intended application.

SUMMARY OF THE INVENTION

Content addressable memory (CAM) devices according to embodiments of the present invention provide improved reliability by inhibiting disabled CAM cells within defective columns from contributing to either sustained or intermittent look-up errors when the CAM device is operated in an intended application. The improved reliability is preferably achieved in volatile CAM devices by configuring (e.g., programming) each column driver that is associated with a CAM array having a defective column therein to preserve intentionally written data and/or mask values of the disabled CAM cells across repeated power reset events that may occur at the chip or system level. Still further improvements in reliability can be achieved by configuring each column driver that is associated with a CAM array having an unused redundant column of CAM cells therein to preserve intentionally written data and/or mask values of the CAM cells in the unused redundant column across the power reset events. Preserving these intentionally written data and/or mask values in defective column CAM cells (and/or inactive redundant column CAM cells) operates to reduce the number of CAM cells that are likely to contribute to sustained or intermittent look-up (or other) errors that may occur after a CAM device is tested and shipped to a user.

In particular, CAM devices according to first embodiments of the present invention comprise at least one CAM array and a column driver circuit that is electrically coupled to the CAM array by bit lines and/or data lines. The CAM array has a plurality of main columns of CAM cells and at least one redundant column of CAM cells therein. During initial testing, a first one of the main columns of CAM cells may be identified as a defective column and replaced by another column in the CAM array. In response to detecting the defective column during testing, the redundant column of CAM cells may be enabled and used as a replacement for one of the main columns. The column driver circuit, also referred to herein as a bit line driver circuit (or bit/data line driver circuit), is preferably programmed to enable the redundant column and disable the defective column. Once programmed, the column driver circuit may drive at least one disabled CAM cell in the defective column with a respective fixed data value. This operation is preferably performed whenever the at least one disabled CAM cell undergoes a write operation. After being programmed, the CAM device may again be tested to assess yield prior to shipping to the user.

The disabled CAM cell may be a CAM cell having a data RAM cell and a mask RAM cell therein. In this case, the column driver circuit is also preferably programmed to drive the mask RAM cell with a respective fixed mask value whenever the mask RAM cell undergoes a write operation. The data RAM cell and the mask RAM cell may be selected from a group consisting of SRAM cells, DRAM cells and nonvolatile RAM cells (e.g., EEPROM). According to a preferred aspect of this embodiment, the column driver circuit is programmed (e.g. fuse-programmed) to drive the bit lines associated with a defective column with the same fixed data value whenever any one of the disabled CAM cells in the defective column undergoes a write operation.

CAM devices according to second embodiments of the present invention preferably include a CAM array having a plurality of main columns of CAM cells and at least one redundant column of CAM cells therein. The main and redundant columns of CAM cells are preferably coupled to a bit line driver circuit. In response to yield testing, the bit line driver circuit is programmed to preserve previously written data values of column disabled CAM cells across a power reset event so that each column disabled CAM cell associated with a row containing a valid entry prior to a power reset event is rewritten again with a same data value it had prior to the power reset event. These rewriting operations are performed in sequence as rows within the CAM array are updated with new entries after the power reset event. The column disabled CAM cells include CAM cells located in inactive defective columns and/or unused redundant columns. The column disabled CAM cells are preferably volatile CAM cells that retain one of three states (1, 0, X) that can be evaluated during search operations. Such CAM cells may include a data RAM cell and a mask RAM cell. The CAM cell may be configured so that the mask RAM cell can be read along with the data RAM cell during a reading operation. The bit line driver circuit is also preferably programmed to preserve the mask values of the column disabled CAM cells across a power reset event.

Still further embodiments of the present invention include methods of operating content addressable memory (CAM) devices by writing a first data value and second data/mask value into a CAM cell comprising first and second RAM cells that share a respective word line and are separated by compare logic having true and complementary data inputs that are electrically coupled to a true data line D and a complementary data line DB, respectively. In preparation of a search operation, a match line and a pseudo-ground line associated with a row of CAM cells are precharged high. A potential of the true data line is then at least partially equilibrated with a potential of the complementary data line by transferring charge between the true and complementary data lines. The data lines are then driven rail-to-rail to represent a logic 1 or logic 0 value thereon as a bit of a comparand. An operation to compare a state of the CAM cell with the bit of the comparand is then performed, in response to pulling the precharged pseudo-ground line low. The step to equilibrate data line potentials preferably includes transferring charge from a more positively biased one of the true and complementary data lines to a less positively biased one of the true and complementary data lines for a duration sufficient to achieve a potential difference between the true and complementary data lines that is less than about 30% of a rail-to-rail voltage (i.e., less than about $0.3(Vdd-|Vss|)$).

A content addressable memory (CAM) device according to another embodiment of the present invention includes a CAM array having a disabled CAM cell therein. The disabled CAM cell includes a first RAM cell and a second RAM cell that share a respective word line. First and second pairs of differential bit lines are also provided. The first pair of differential bit lines (e.g., B1, B1B) are electrically connected to the first RAM cell and the second pair of differential bit lines (e.g., B2, B2B) are electrically connected to the second RAM cell. A bit/data line control circuit is also provided. The bit/data line control circuit is fuse-programmed to clamp and hold a first one of the first pair of differential bit lines (e.g., B1/DB) and a first one of the second pair of differential bit lines (e.g., B2/D) at a first voltage level (e.g., Vss) when the CAM array undergoes reading, writing and search operations.

BRIEF DESCRIPTION OF THE DRAWINGS

FIG. 1D illustrates a data line control circuit and a fuse-programmable circuit for a redundant column of a CAM array, according to the prior art.

FIG. 1E illustrates a conventional bit line control circuit.

FIG. 6 is a block diagram of a partially full CAM array undergoing a search operation with an applied search word, according to another embodiment of the present invention.

DESCRIPTION OF PREFERRED EMBODIMENTS

Figure 1A:
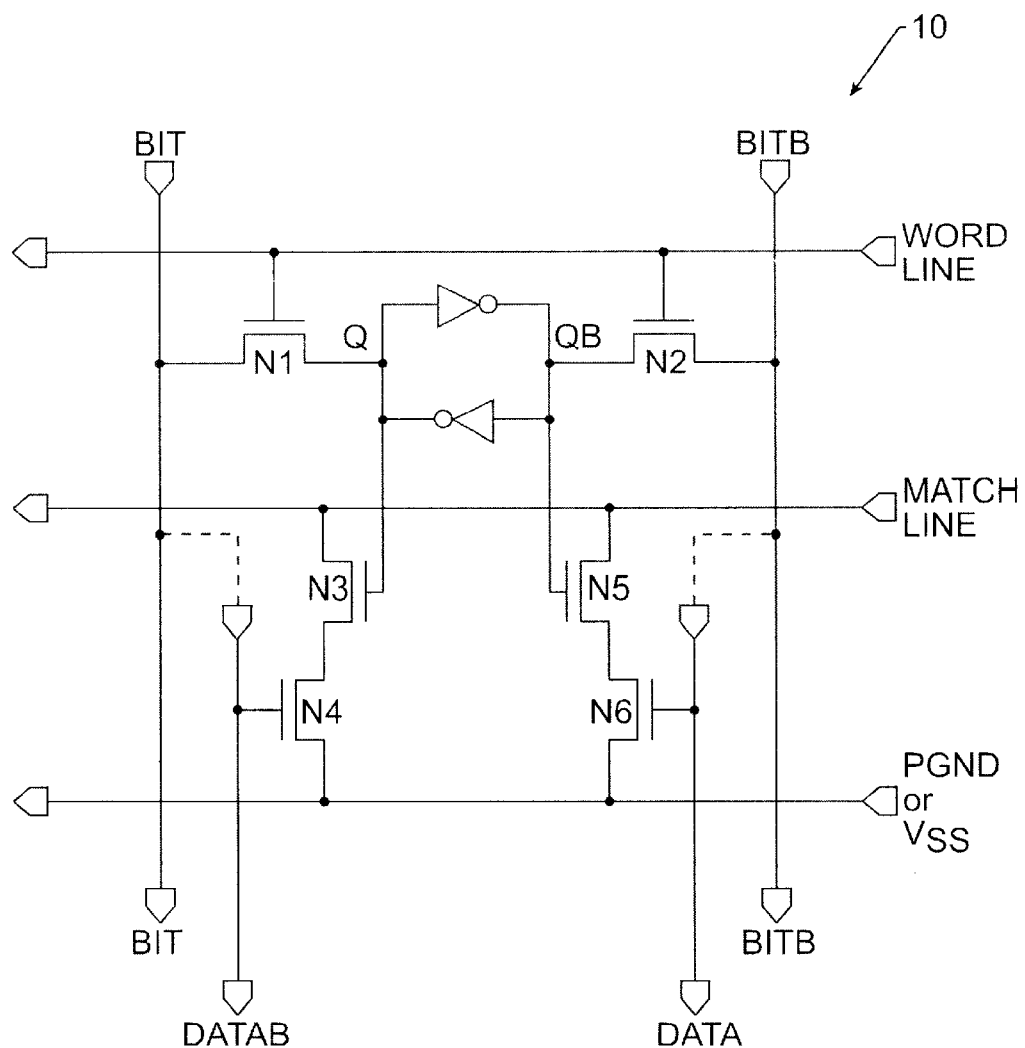
FIG. 1A is an electrical schematic of a conventional 10T CAM cell.
Figure 1B:
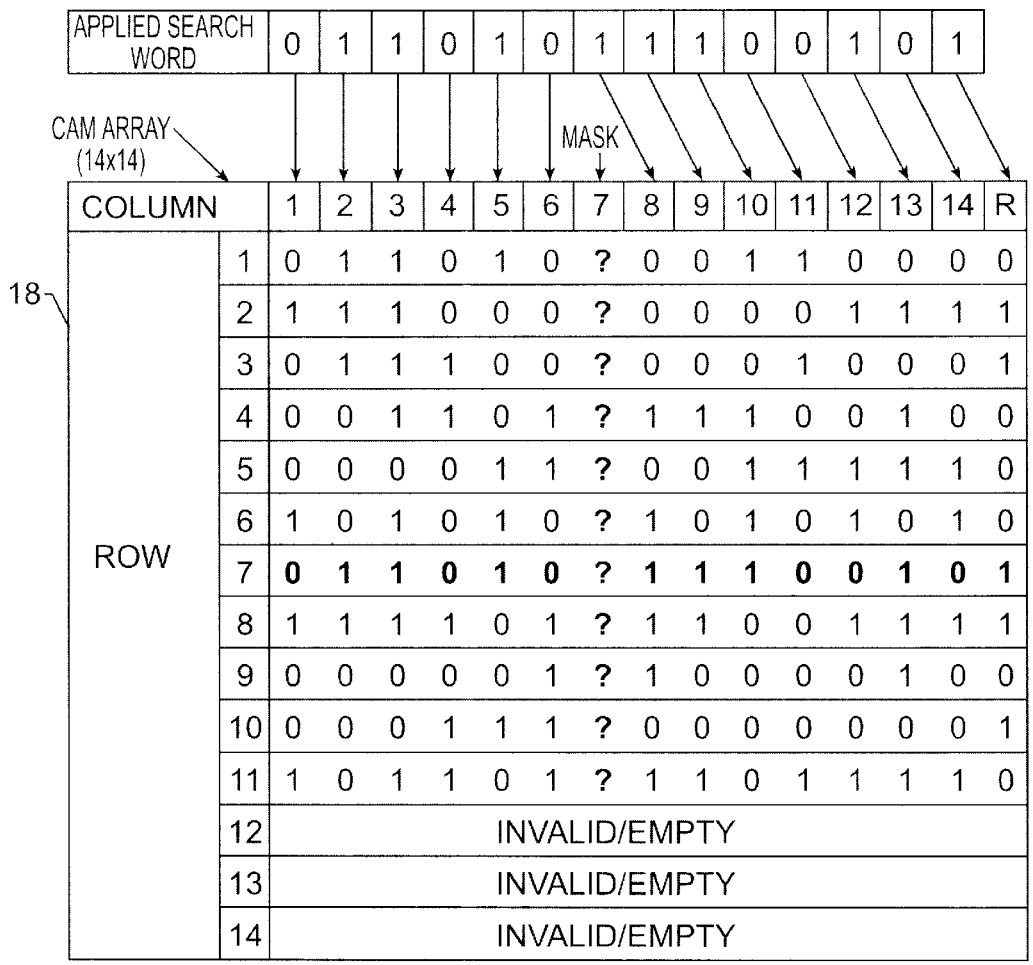
FIG. 1B is a block diagram of a partially full CAM array undergoing a search operation with an applied search word, according to the prior art.
Figure 1C:
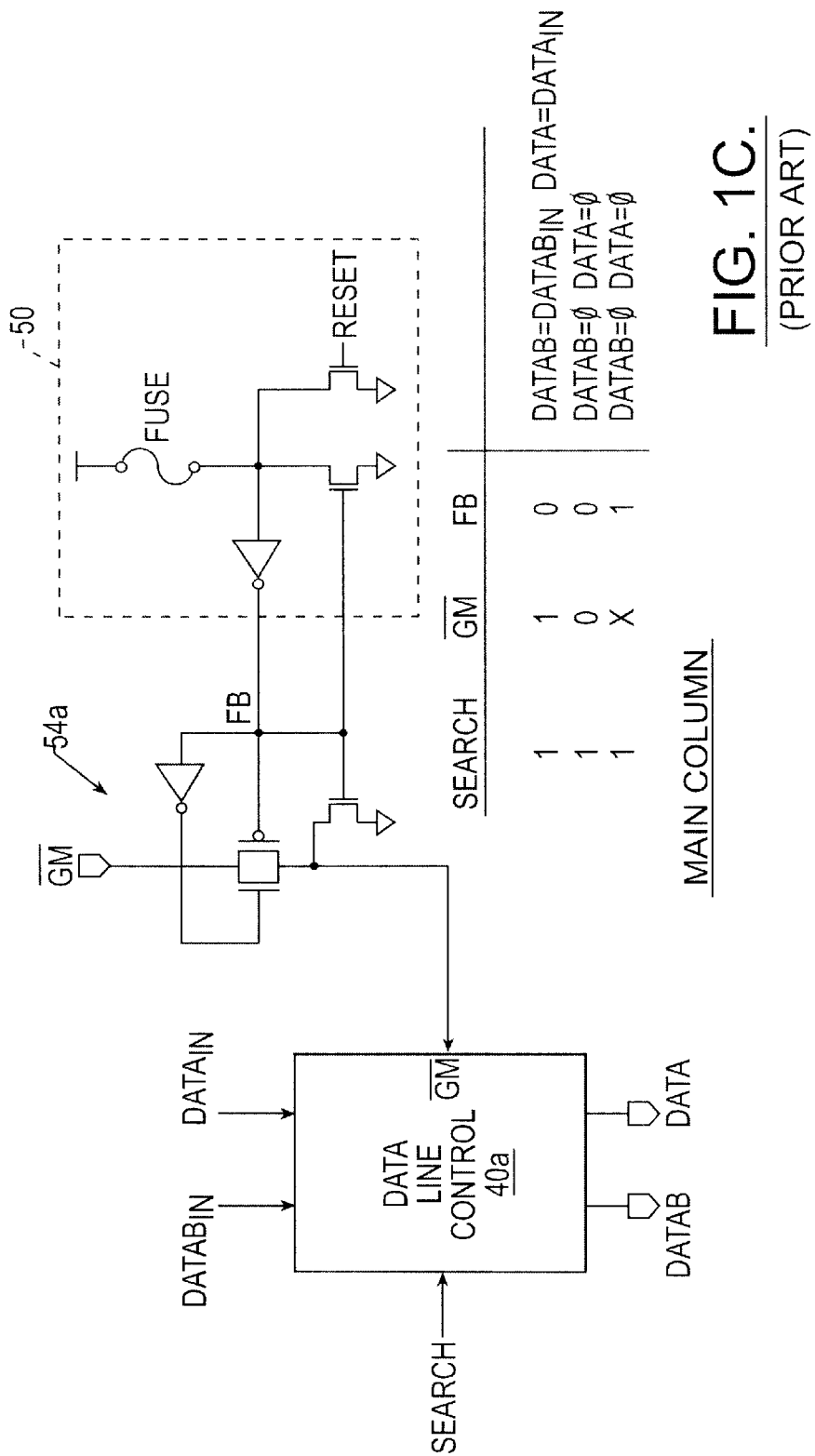
FIG. 1C illustrates a data line control circuit and a fuse-programmable circuit for a main column of a CAM array, according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

As described above with respect to FIGS. 1A–1B and 2–4, improved yield may be achieved when manufacturing CAM devices by designing CAM arrays to include one or more redundant columns of CAM cells that can be enabled in response to detecting a defective column of CAM cells during manufacturer yield testing. Moreover, because a defective column of CAM cells is typically globally masked when a respective CAM array is searched, the data and/or mask values stored in CAM cells within a defective column typically achieve random or arbitrary values upon power up and these values may later change in response to changes in operating conditions (e.g., power reset events). Unfortunately, such changes in the data and/or mask values of CAM cells within a defective column may cause conventional CAM devices to exhibit relatively poor reliability when they are used in an intended application by a customer. This poor reliability may be present even if such CAM devices successfully pass comprehensive yield testing prior to shipping.

For example, if the CAM cell 10 of FIG. 1A resides within a defective column that has been replaced and the CAM cell 10 has a leaky transistor N4 within its compare circuit, then the "defective" CAM cell 10 may be properly masked during a manufacturer's yield test so long as the data value stored within the CAM cell 10 is a logic 0 value and the transistor N3 thereby remains off. Under these specific conditions, the CAM device may pass the manufacturer's yield test. However, if the data value within the defective CAM cell 10 changes to a logic 1 value, in response to a change in operating condition (e.g., power reset), transistor N3 will turn on and a sufficiently conductive path may be established through the series connection of transistor N3 and the leaky transistor N4. This conductive path may operate to pull-down the match line from its precharged high level to thereby indicate a miss condition. This miss condition may be erroneous if the CAM cell 10 is located in a row containing an entry that matches the applied search word. Such a miss condition is typically intermittent because it requires the defective CAM cell to retain a logic 1 data value and also be located in a row containing an entry that happens to match an applied search word. Because these two required conditions may occur infrequently, a manufacturer's yield test may not successfully spot the defect prior to shipping to a customer.

Figure 2:
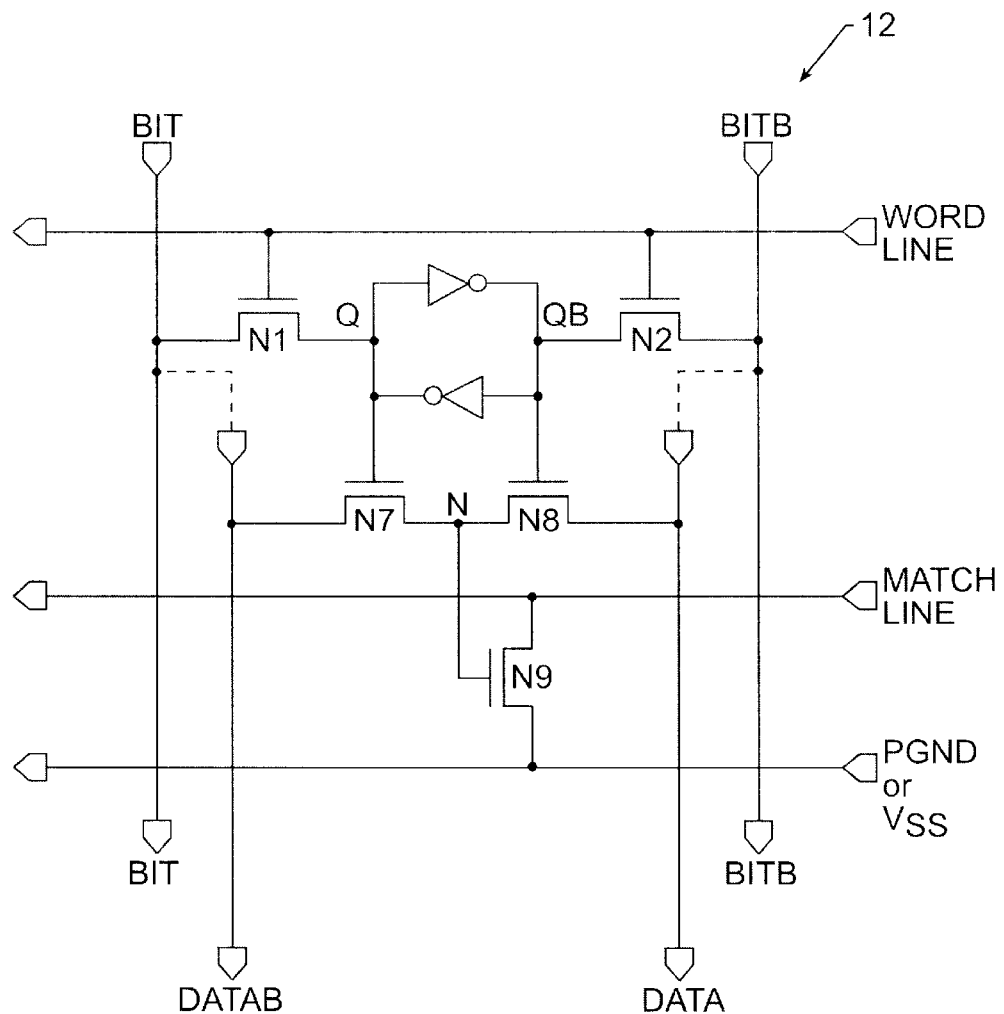
FIG. 2 is an electrical schematic of a conventional 9T CAM cell.

A similar intermittent error may also occur using the CAM cell 12 of FIG. 2. For example, if the transistor N7 in the CAM cell 12 of FIG. 2 is "open" and the stored data value is a logic 0 value (i.e., Q=0, QB=1), then transistor N8 will be conductive and the gate of transistor N9 will be held low at the potential of complementary bit line BITB (where BIT=BITB=0 when the defective column is masked during a search operation). Under these conditions, the CAM cell 12 will not erroneously indicate a miss condition. However, if the stored data value is a logic 1 value (i.e., Q=1, QB=0), then both transistors N7 and N8 will be held off and node N will be floating. In particular, node N may be floating high in response to capacitive coupling with the true output node Q of the SRAM data cell, which is set at a logic 1 value. This potentially high voltage at node N may cause transistor N9 to turn on and thereby pull the match line low and erroneously indicate a miss condition.

Figure 3:
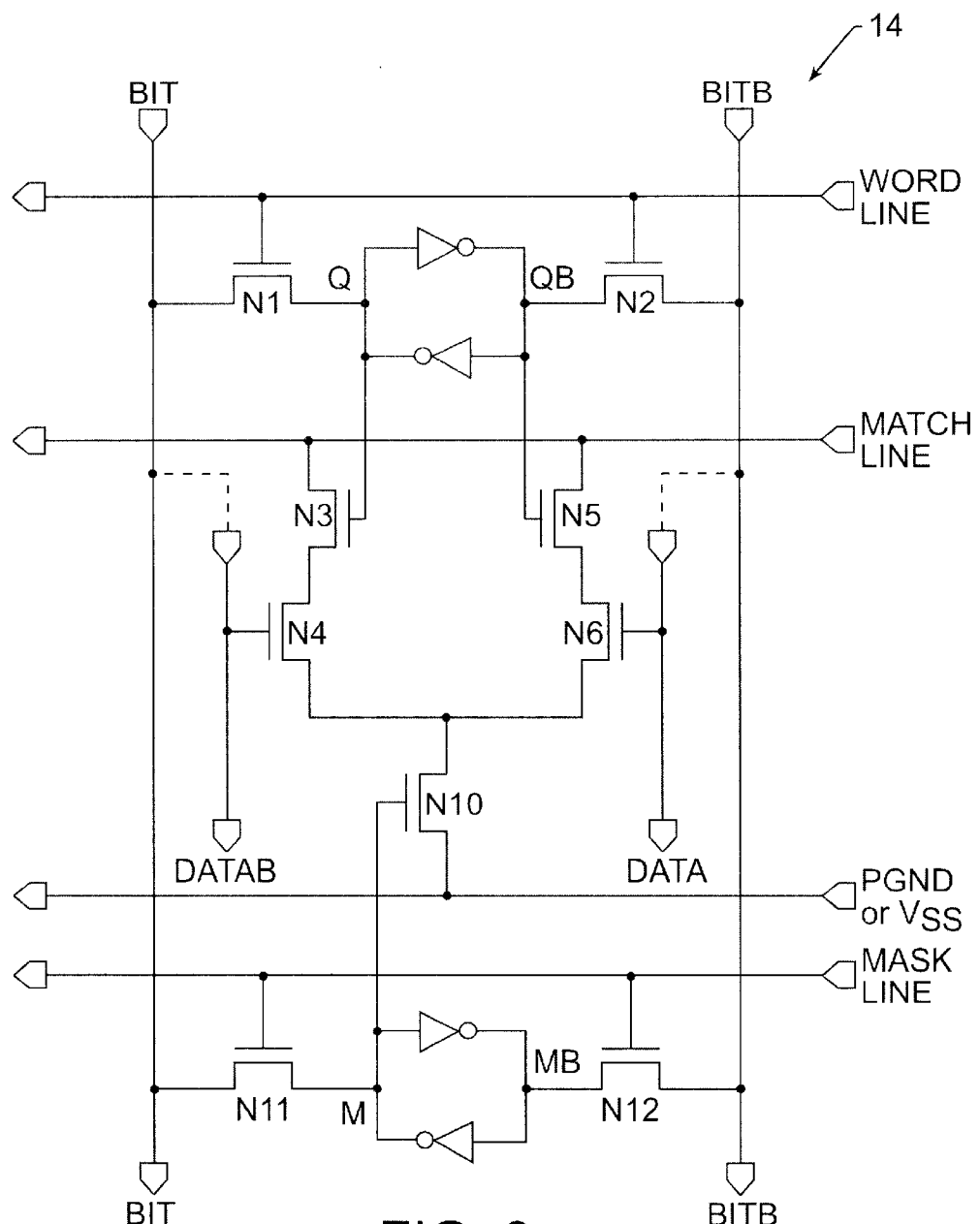
FIG. 3 is an electrical schematic of a conventional 17T CAM cell.
Figure 4:
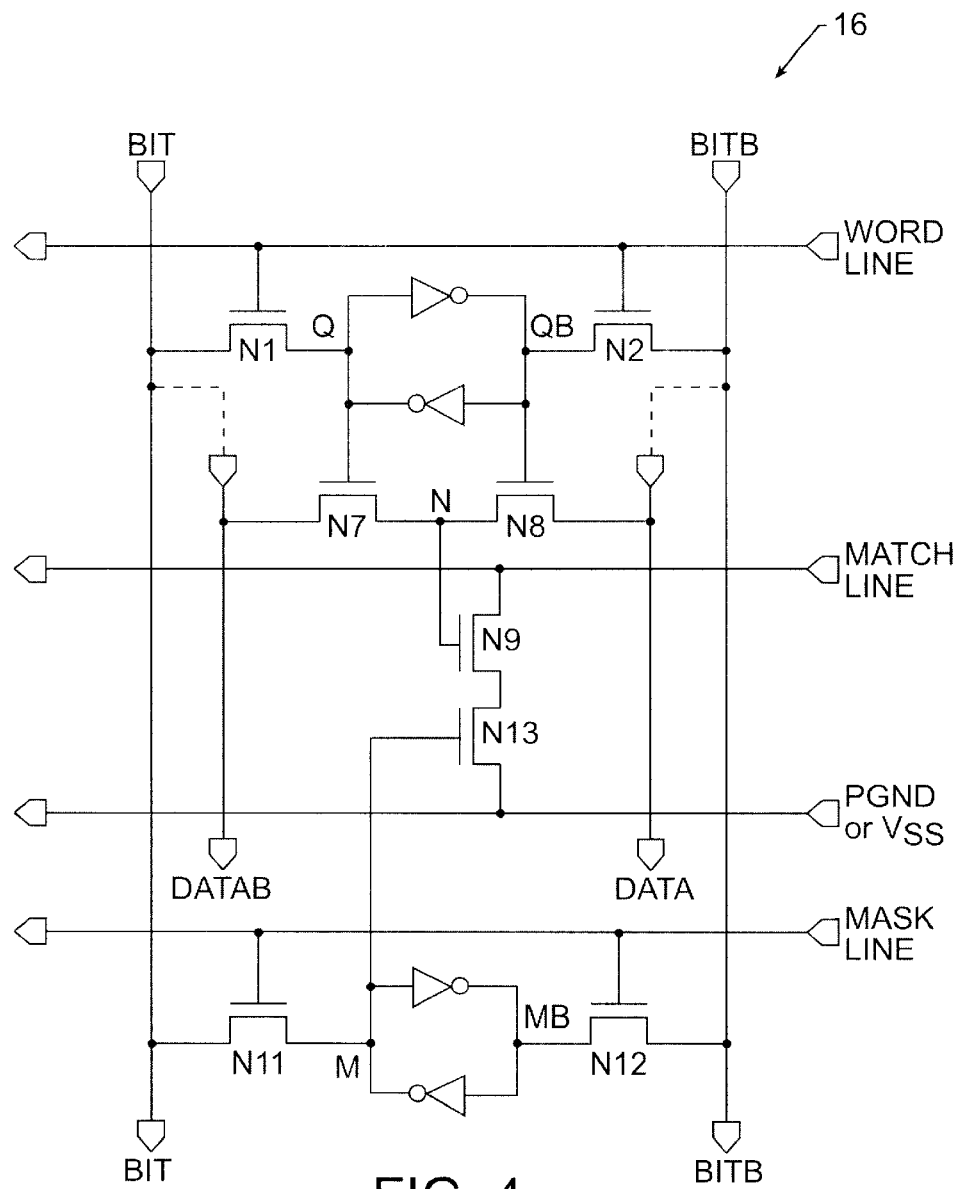
FIG. 4 is an electrical schematic of a conventional 16T CAM cell.

Similarly, if transistor N4 in the CAM cell 14 of FIG. 3 is leaky and the mask SRAM cell is storing a logic 1 value (i.e., M=1 and MB=0), then an erroneous miss condition may result if the data SRAM cell is storing a logic 1 value. Finally, if transistor N7 in the CAM cell 16 of FIG. 4 is open and the mask SRAM cell is storing a logic 1 value (i.e., M=1 and MB=0), then an erroneous miss condition may result if the data SRAM cell is storing a logic 1 value. Thus, in order for the CAM cell 16 of FIG. 4 to indicate an erroneous miss condition that can be detected during yield testing, three conditions should be met in the event transistor. N7 is open: (i) the mask SRAM cell should be inactive (i.e., M=1, MB=0), (ii) the true output Q of the data SRAM cell should be set to a logic 1 value and (iii) the defective CAM cell 16 must reside within a row having an entry that matches the applied search word. Because the likelihood that conditions (i)–(iii) will all be present simultaneously is typically relatively small, a CAM cell 16 having the same or an analogous defect(s) to the one described may only contribute to relatively infrequent intermittent errors that may not be readily detectable during yield testing by a manufacturer.

Figure 5A:
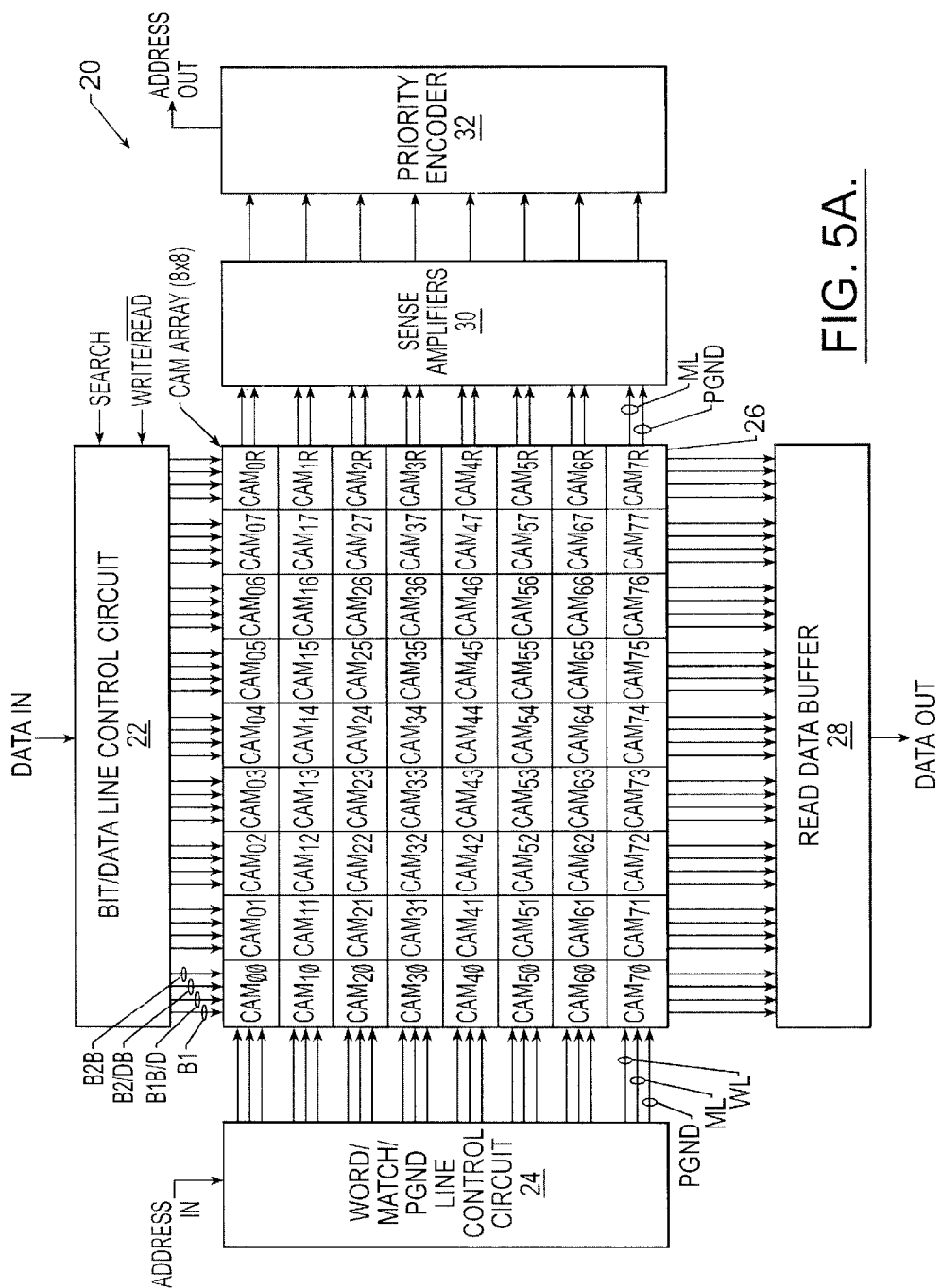
FIG. 5A is a block diagram of a 64-bit CAM device having column redundancy, according to an embodiment of the present invention.

To address the reliability limitations associated with conventional CAM devices, the CAM device 20 of FIG. 5A is provided with control circuitry that inhibits the occurrence of the reliability errors described above by intentionally writing each column disabled CAM cell in a row containing a valid entry with a respective data value (1 or 0) that is preserved every time the CAM device is "rebooted" or otherwise undergoes a power reset event. As illustrated by FIG. 5A, a preferred CAM device 20 includes a CAM array 26 having at least one redundant column, shown as column "R". For purposes of illustration only, the CAM array 26 of FIG. 5A has a capacity of 64 data bits. The CAM array 26 is arranged into eight (8) rows with eight (8) main columns (0–7) and one redundant column "R").

A row control circuit 24 is also provided. The row control circuit 24 is illustrated as a word/match/pgnd line control circuit. The row control circuit 24 may receive, among other things, an input address of a row to be accessed (written to or read from) in the CAM array 26. As illustrated, the row control circuit 24 may generate respective word line signals WL, match line signals ML and pseudo-ground line signals PGND to each row of CAM cells within the CAM array 26. In alternative embodiments, the row control circuit 24 may omit generation of the pseudo-ground line PGND signals in the event the CAM cells are connected directly to a fixed reference potential (e.g., Vss). Each row of the CAM array 26 may also be electrically coupled by respective match lines and pseudo-ground lines PGND to a bank of sense amplifiers 30. Using conventional match line signal detection techniques, the bank of sense amplifiers 30 may provide one or more active match signals to a row priority encoder 32. In response, the row priority encoder 32 may output an address of a highest priority matching entry within the CAM array 26. The row priority encoder may be of conventional design.

A read data buffer 28 is provided. The read data buffer 28 may be electrically coupled to each column of the CAM array 26 by two respective pairs of differential bit/data lines, for example. These differential lines are shown as B1, B1B, B2 and B2B. The read data buffer 28 is configured to latch in a row of data read from the CAM array 26 during a read operation and provide the read data to an output port (shown as DATA OUT). As described more fully hereinbelow, a read operation may be performed by initially driving (and then floating) all the pairs of differential bit lines high and then accessing a particular row of CAM cells by driving a respective word line WL high. The read data buffer 28 may be of conventional design.

A preferred column control circuit 22 is provided for driving all normal and redundant columns of CAM cells with write data during write operations and comparand data during search operations, which are also frequently referred to as "look-up" or compare operations. The comparand data may include all bits of a search word received at an input port (shown as DATA IN) or a combination of a plurality of bits of the search word and one or more global mask bits (i.e., D=DB=0). As illustrated, the column control circuit 22 may be electrically connected to each column of the CAM array 26 by two pairs of bit lines (shown as B1, B1B and B2, B2B). A complementary one of the first pair of bit lines (i.e., B1B) and a true one of the second pair of bit lines (i.e., B2) may also be used as a pair of differential data lines (i.e., D, DB). Thus, the four lines associated with each column of CAM cells may be identified from left to right as B1, B1B/D, B2/DB and B2B. This aspect of the CAM array is more fully illustrated by FIG. 5B.

The column control circuit 22, which is shown in the preferred embodiment of FIG. 5A as a bit/data line control circuit, preferably includes programmable circuitry (e.g., fuse-programmable circuitry) that can disable a defective main column of CAM cells within the CAM array 26 and enable a redundant column of CAM cells as a replacement for a main column of CAM cells. This programmable circuitry within the column control circuit may also have a default state whereby the redundant column is disabled unless yield testing detects a defective main column and a fuse is cut to recognize the redundant column as a replacement column. Memory devices that utilize control circuits to provide column redundancy are more fully described in U.S. application Ser. No. 09/617,155 to Bishop, entitled "Integrated Circuit Memory Devices Having Control Circuits Therein That Provide Column Redundancy Capability," now U.S. Pat. No. 6,373,757, assigned to the present assignee, the disclosure of which is hereby incorporated herein by reference.

As described more fully hereinbelow with respect to FIGS. 7A–7B, a CAM array having the preferred fuse-programmable circuitry may include a column of disabled CAM cells, with each disabled CAM cell including a first RAM cell and a second RAM cell that share a respective word line. First and second pairs of differential bit lines are also provided. The first pair of differential bit lines are electrically connected to inputs of each first RAM cell in a respective column and the second pair of differential bit lines are electrically connected to inputs of each second RAM cell in a respective column. The fuse-programmable circuitry within the column control circuit also preferably operates to (i) clamp a first one of the first pair of differential bit lines and a first one of the second pair of differential bit lines at a first voltage level (e.g., Vss) and to (ii) clamp a second one of the first pair of differential bit lines and a second one of the second pair of differential bit lines at a second voltage level (e.g., Vdd), whenever the CAM array undergoes reading, writing or search operations.

Figure 5B:
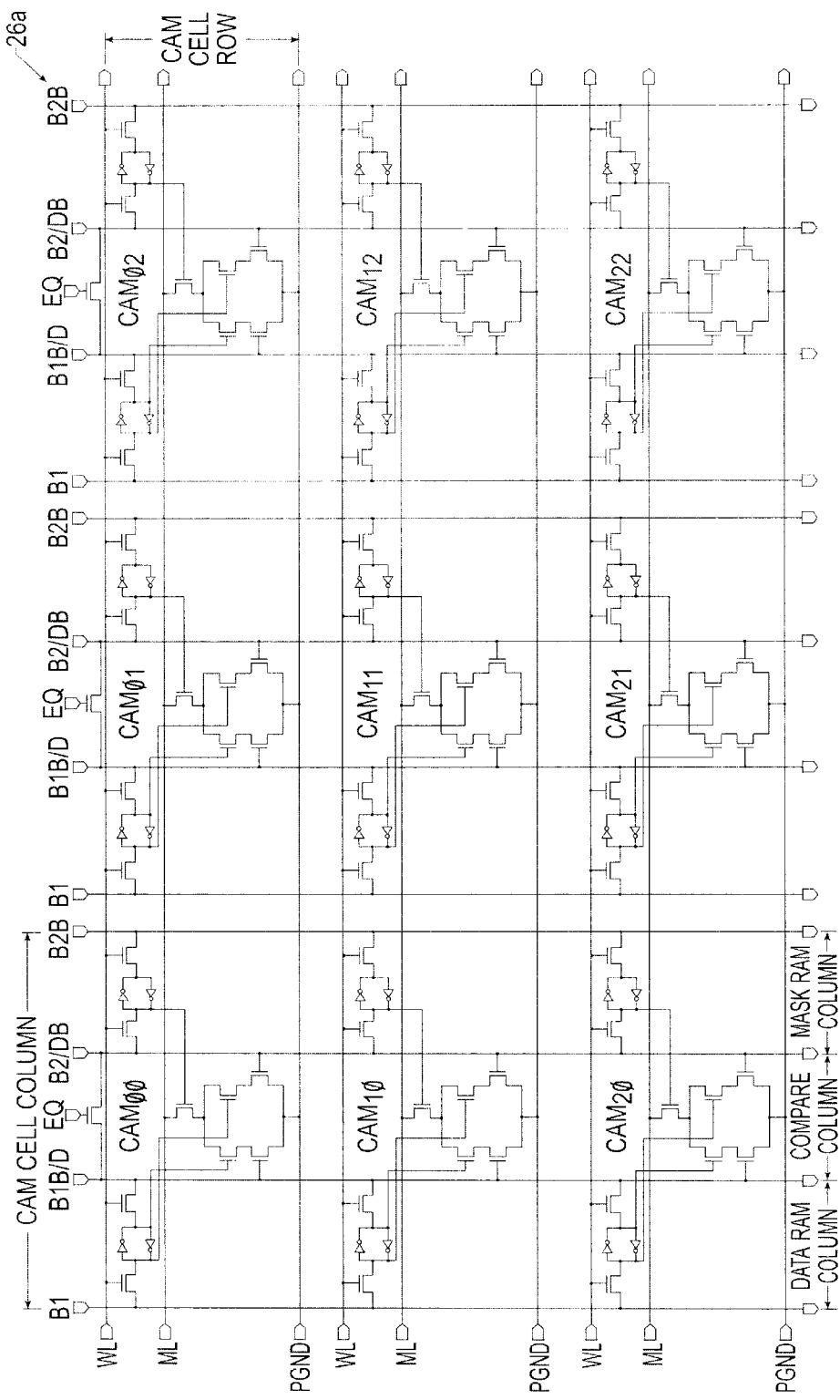
FIG. 5B is a detailed electrical schematic of an array of CAM cells that may be used in the CAM device of FIG. 5A.

Operation of the CAM device 20 of FIG. 5A will now be described more fully with respect to the 3×3 CAM array section 26a of FIG. 5B. As illustrated, the CAM array section 26a of FIG. 5B maps to rows 0–2 at the top left corner of the CAM array 26 of FIG. 5A. The CAM array section 26a of FIG. 5B illustrates a preferred "lateral" arrangement of each CAM cell. This lateral arrangement improves the width/depth ratio of the CAM array 26 by increasing the width and shortening the height of CAM cells in the array 26. This lateral arrangement also enables the bit/data lines to be shorter in length. Each CAM cell column in the array section 26a of FIG. 5B includes a data RAM column, a compare circuit column and a mask RAM column located side-by-side. Each data RAM cell and mask RAM cell within a respective CAM cell share a common word line, which means the data RAM cell and mask RAM cell may be written to and read from simultaneously. Based on the preferred lateral arrangement, a CAM array 26 having a logic width of 72 and a logical depth of 512 will include 144 main columns of RAM cells plus 72 columns of compare circuits that have a depth of 512. Thus, a preferred CAM array may be arranged as 216 (144+72) columns that each have a depth of 512, for a width/depth ratio of (216/512)= 0.42. In contrast, a conventional CAM array comprising the CAM cells of FIG. 3 and having a logical width of 72 and a logical depth of 512, will include 1024 rows of RAM cells plus 512 rows of compare circuits, for a width/depth ratio of 72/1536=0.05.

Data is written to or read from a data RAM cell using the leftmost pair of differential bit lines (B1, B1B) associated with a respective CAM cell column. Data is also written to or read from a mask RAM cell using the rightmost pair of differential bit lines (B2, B2B) associated with a respective CAM cell column. During a read operation, the leftmost pair or differential bit lines (B1, B1B) and the rightmost pair of differential bit lines (B2, B2B) are typically driven high to logic 1 values and then the outputs of the column control circuit 22 are disposed in high impedance states. A word line WL associated with a row being addressed is then driven high to turn on the input access transistors associated with each data RAM cell and mask RAM cell in the respective row. The bit lines can then be monitored (i.e., "read") to determine the resulting data and mask values on the bit lines (B1, B1B, B2 and B2B). However, because the read data buffer 28 is typically configured to ignore one or more disabled columns within the CAM array during a read operation (because the data in a disabled column is irrelevant from a read standpoint), these bit line biasing operations need not be performed in the same manner on the bit lines associated with the disabled column(s).

According to an additional preferred aspect of the column control circuit 22 and the row control circuit 24 of FIG. 5A, each operation to write a new entry into a respective row within the CAM array 26 includes writing a data/mask value into each column disabled CAM cell within the respective row. These data/mask values are preferably fixed so that after a CAM array has been partially or completely filled, all column disabled CAM cells that are located in rows having valid entries retain the same data/mask values. It is also preferred that after each power reset event (e.g., reboot) or reloading of the CAM array with one or more new entries, all column disabled CAM cells in rows having valid entries be restored with the same data/mask value so that search operations may be reliably performed (and performed under the same data/mask values as those present in the disabled cells during initial yield testing by the manufacturer). Restoring the same data/mask values may require rewriting one or more of the column disabled CAM cells. Loading each column disabled CAM cell with a same fixed data/mask value may be most readily achieved by fuse-programming one or more pairs of bit line drivers (e.g., CMOS drivers) within the column control circuit 22. In particular, the bit line drivers associated with a defective column (or unused redundant column) may be configured to drive the two pairs of bit lines to the following fixed states during write operations: B1=0, B1B=1, B2=0, B2B=1 (when an input signal WRITE to the column control circuit 22 is active). Driving the two pairs of bit lines to the illustrated fixed states may also be performed whenever the CAM array 26 is undergoing a search operation (and B1B and B2 operate as a pair of data lines for comparand data) and whenever the CAM array 26 is undergoing a read operation.

Alternatively, the column control circuit 22 and row control circuit 24 may be configured so that each column disabled CAM cell in a row containing a valid entry retain or be reloaded with its respective data/mask value whenever its respective row is reloaded with a valid entry. Thus, each column disabled CAM cell in a physically even row may receive and retain one data/mask value combination (e.g., DATA←1, MASK←0) and each column disabled CAM cell in a physically odd row may receive and retain another data/mask value combination (e.g., DATA←0, MASK←0). This configuration may require a greater degree of programming circuitry relative to the embodiment that drives all column disabled CAM cells with a same fixed data/mask value.

A number of examples will now be provided. As a first example, assume the CAM array 26 of FIG. 5A includes the CAM cells illustrated by FIG. 5B and that column 2 of the CAM array 26 is defective and that replacement column R is enabled. Then, under these assumptions, an operation to write a new entry equal to {10010010} and a local mask equal to {11111100} into row 0 will preferably cause the CAM cells $CAM_{00}$–$CAM_{0R}$ in row 0 to be written as follows:

| ROW 0 ← 100100XX | |
| --- | --- |
| DATA $RAM_{00}$ ← 1 | MASK $RAM_{00}$ ← 1 |
| (B1 = 1, B1B = 0) | (B2 = 1, B2B = 0) |
| DATA $RAM_{01}$ ← 0 | MASK $RAM_{01}$ ← 1 |
| (B1 = 0, B1B = 1) | (B2 = 1, B2B = 0) |
| DATA $RAM_{02}$ ← 0 | MASK $RAM_{02}$ ← 0 |
| (B1 = 0, B1B = 1) | (B2 = 0, B2B = 1) |
| DATA $RAM_{03}$ ← 0 | MASK $RAM_{03}$ ← 1 |
| (B1 = 0, B1B = 1) | (B2 = 1, B2B = 0) |
| DATA $RAM_{04}$ ← 1 | MASK $RAM_{04}$ ← 1 |
| (B1 = 1, B1B = 0) | (B2 = 1, B2B = 0) |
| DATA $RAM_{05}$ ← 0 | MASK $RAM_{05}$ ← 1 |
| (B1 = 0, B1B = 1) | (B2 = 1, B2B = 0) |
| DATA $RAM_{06}$ ← 0 | MASK $RAM_{06}$ ← 1 |
| (B1 = 0, B1B = 1) | (B2 = 1, B2B = 0) |
| DATA $RAM_{07}$ ← 1 | MASK $RAM_{07}$ ← 0 |
| (B1 = 1, B1B = 0) | (B2 = 1, B2B = 1) |
| DATA $RAM_{0R}$ ← 0 | MASK $RAM_{0R}$ ← 0 |
| (B1 = 0, B1B = 1) | (B2 = 1, B2B = 1) |

As a second example, if column 2 of the CAM array 26 is disabled and the replacement column R is enabled, then an operation to write a new entry equal to {11110010} and a local mask equal to {11111000} into row 7 will preferably cause the CAM cells $CAM_{70}$–$CAM_{7R}$ in row 7 to be written as follows:

| ROW 7 ← 11110XXX | |
| --- | --- |
| DATA $RAM_{70}$ ← 1 | MASK $RAM_{70}$ ← 1 |
| DATA $RAM_{71}$ ← 1 | MASK $RAM_{71}$ ← 1 |
| DATA $RAM_{72}$ ← 0 | MASK $RAM_{72}$ ← 0 |
| DATA $RAM_{73}$ ← 1 | MASK $RAM_{73}$ ← 1 |
| DATA $RAM_{74}$ ← 1 | MASK $RAM_{74}$ ← 1 |
| DATA $RAM_{75}$ ← 0 | MASK $RAM_{75}$ ← 1 |
| DATA $RAM_{76}$ ← 0 | MASK $RAM_{76}$ ← 0 |
| DATA $RAM_{77}$ ← 1 | MASK $RAM_{77}$ ← 0 |
| DATA $RAM_{7R}$ ← 0 | MASK $RAM_{7R}$ ← 0 |

As a third example, if an operation to write an updated entry equal to {00000010} and a local mask equal to {1110000} into row 7 is performed after the write operation described by the second example has been performed, CAM cells $CAM_{70}$–$CAM_{7R}$ in row 7 may be written as follows:

| ROW 7 ← 0000XXXX | |
| --- | --- |
| DATA $RAM_{70}$ ← 0 | MASK $RAM_{70}$ ← 1 |
| DATA $RAM_{71}$ ← 0 | MASK $RAM_{71}$ ← 1 |
| DATA $RAM_{72}$ ← 0 | MASK $RAM_{72}$ ← 0 |
| DATA $RAM_{73}$ ← 0 | MASK $RAM_{73}$ ← 1 |
| DATA $RAM_{74}$ ← 0 | MASK $RAM_{74}$ ← 1 |
| DATA $RAM_{75}$ ← 0 | MASK $RAM_{75}$ ← 0 |

-continued

| ROW 7 ← 0000XXXX | |
|---|---|
| DATA RAM$_{76}$ ← 0 | MASK RAM$_{76}$ ← 0 |
| DATA RAM$_{77}$ ← 1 | MASK RAM$_{77}$ ← 0 |
| DATA RAM$_{7R}$ ← 0 | MASK RAM$_{7R}$ ← 0 |

Alternatively, because the column disabled CAM cell in row 7 was correctly written to in example 2 (with DATA RAM$_{72}$←0 and MASK RAM$_{72}$←0), the bit lines B1, B1B, B2 and B2B within column 2 may all be driven to logic 1 values so that the disabled CAM cell in row 7 (i.e., CAM$_{72}$) undergoes a nondestructive read operation while the other CAM cells in row 7 undergo a write operation. This alternative, which requires additional circuitry to implement, is not preferred.

As described above, the complementary bit line in the leftmost pair (shown as B1B) and the true bit line in the rightmost pair (shown as B2) also operate as a pair of differential data lines (D, DB) if the CAM cells illustrated by FIG. 5B are used. Each pair of differential data lines D and DB receives a respective comparand bit of an applied search word (where (D=0 and DB=1) or (D=1 and DB=0)) or a global mask bit (D=DB=0), during a search operation. The column control circuit 22 of FIG. 5A may be fuse-programmed to drive the pair of differential data lines associated with each disabled column of the CAM array with only global mask bits during a search operation. In particular, the bit line drivers (e.g., CMOS drivers) associated with a defective column (or unused redundant column) may be configured to drive the respective pair of data lines D and DB to the following fixed states during search operations: D=DB=0 (when an input signal SEARCH to the column control circuit 22 is active). These same states may also apply during write and read operations. Such configuration may involve the blowing of one or more fuses in the column control circuit 22, in response to yield testing.

Figure 5C:
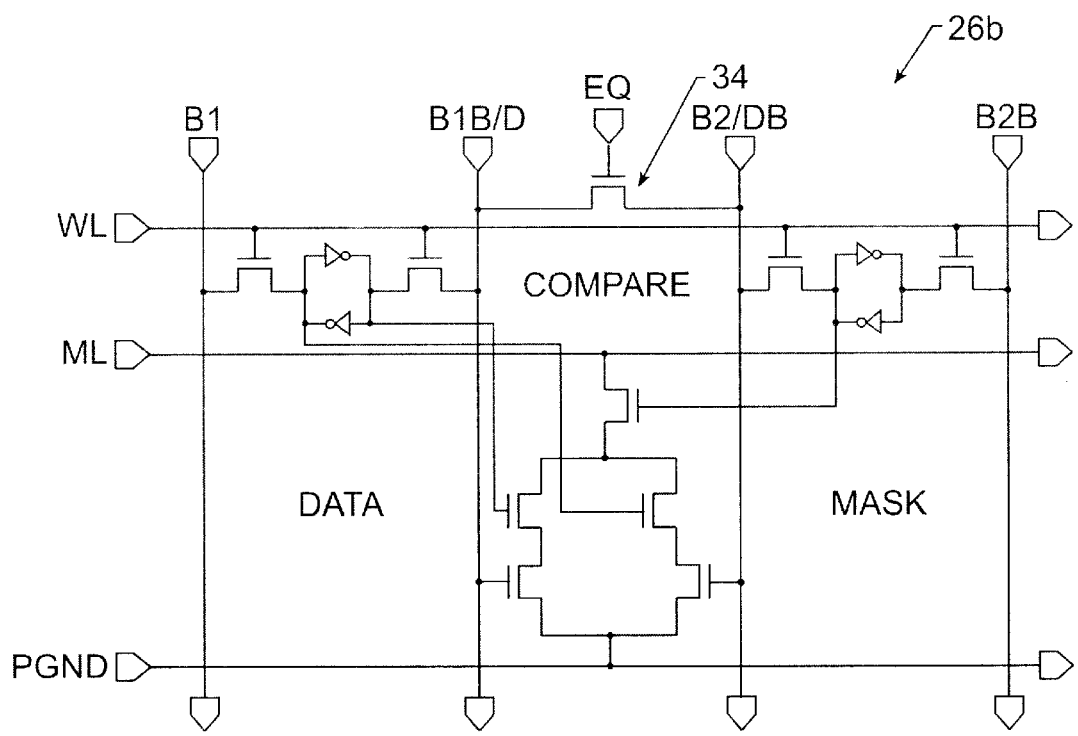
FIG. 5C is an electrical schematic of a preferred CAM cell used in the CAM array of FIG. 5B. An equalization transistor is also included to provide data line charge recycling.

Referring now to FIG. 5C, preferred operations to compare the contents of a preferred "lateral" CAM cell 26b to a corresponding bit of an applied search word (i.e., bit of a comparand) will be described. The lateral CAM cell 26b includes a data RAM cell and a mask RAM cell. Writing to the lateral CAM cell 26b includes driving a first pair of bit lines B1 and B1B with a rail-to-rail signal and also driving a second pair of bit lines B2 and B2B with a rail-to-rail signal. A rail-to-rail signal is typically Vdd-to-Vss (i.e., B1=Vdd, B1B=Vss or B1=Vss, B1B=Vdd). Four possible combinations of bit line signals are possible during a write operation when WL=1:

| CAM cell | Data RAM cell | Mask RAM cell | B1/B1B | B2/B2B |
|---|---|---|---|---|
| 0 | 0 | 1 | 0/1 | 1/0 |
| 1 | 1 | 1 | 1/0 | 1/0 |
| X | 0 | 0 | 0/1 | 0/1 |
| X | 1 | 0 | 1/0 | 0/1 |

During a search operation, the illustrated match line ML and pseudo-ground line PGND are both precharged high and the voltages on the bit/data lines B1B/D and B2/DB are at least substantially equilibrated to about ½Vdd (e.g., to within 30% of the rail-to-rail voltage across a pair of data lines (i.e., 0.3(Vdd−Vss))). This equilibration is achieved by driving a gate of an equalization transistor 34 with an active high signal (i.e., EQ=1). Driving the gate of the equalization transistor 34 with an active high signal will result in a charge transfer between B1B and B2. In this manner, a significant amount of the power supply charge originally required to pull the more positively biased one of B1B and B2 to a logic 1 value can be recycled. Devices and methods of conserving power by recycling charge supplied by a signal line driver to a load having capacitance, including bit line charge, are more fully described in the aforementioned '907 patent to Lien et al. Additional techniques are also described in U.S. Pat. No. 6,307,417, entitled "Integrated Circuit Output Buffers Having Reduced Power Consumption Requirements and Methods of Operating Same," and in U.S. application Ser. No. 10/004,456, filed Oct. 19, 2001, entitled "Complementary Data Line Driver Circuits Having Conditional Charge Recycling Capability and Methods of Operating Same," the disclosures of which are hereby incorporated herein by reference.

After the voltages on the bit/data lines B1B/D and B2/DB have been partially equilibrated or substantially equilibrated (e.g., to within about 0.3(Vdd−Vss)), a respective bit of a comparand (i.e., search word) is driven onto the bit/data lines B1B/D and B2/DB as a differential signal (e.g., D=1, DB=0 or D=0, DB=1). This driving of the bit/data lines B1B/D and B2/DB with a bit of a comparand is performed by the column control circuit 22. An operation to compare the value of the bit of the comparand driven onto the bit/data lines B1B/D and B2/DB with the value of the data stored within the lateral CAM cell 26b can then be initiated by pulling the pseudo-ground line PGND low from a precharge high level. In this manner, the compare circuit within the CAM cell 26b (shown as 5 transistors) can be enabled, and the match line ML can be pulled low from its precharged high level if a miss condition is present and the CAM cell 26b is not locally masked by its internal mask RAM cell (i.e., Mask RAM cell=1). In the event the bit/data lines B1B/D and B2/DB are both driven and held low during a search operation, the CAM cell 26b (and all other CAM cells in the same column) will be globally masked.

Figure 5D:
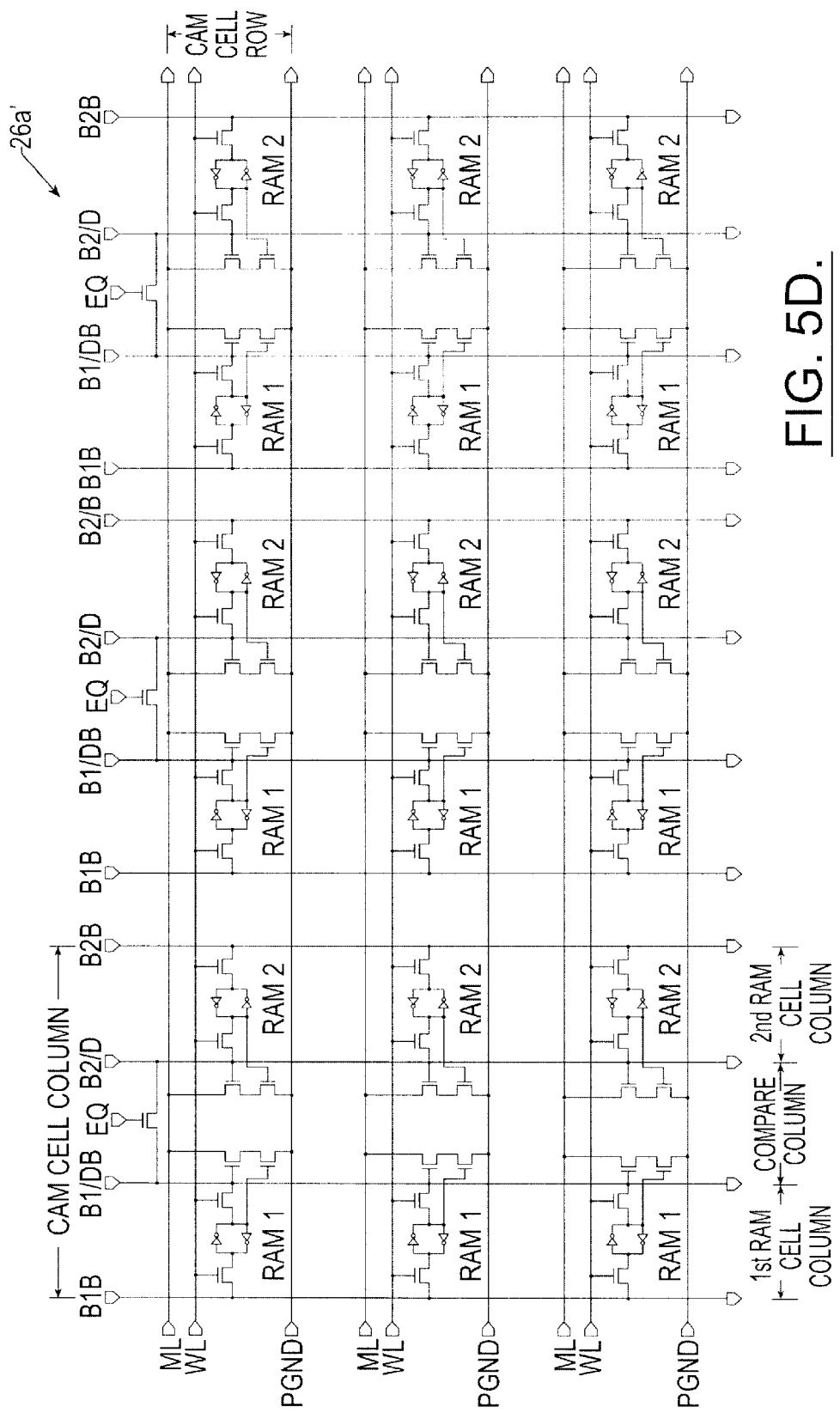
FIG. 5D is a detailed electrical schematic of another CAM array that may be used in the CAM device of FIG. 5A.
Figure 5E:
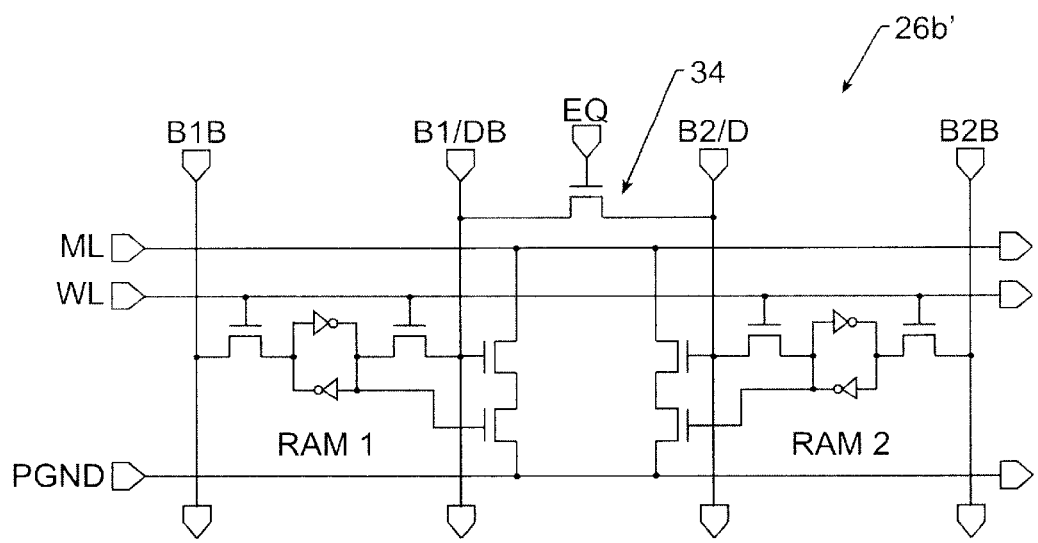
FIG. 5E is an electrical schematic of a preferred CAM cell used in the CAM array of FIG. 5D. An equalization transistor is also included to provide data line charge recycling.

Referring now to FIGS. 5D and 5E, a CAM array 26' according to another preferred embodiment includes lateral CAM cells 26b' that have one fewer transistor relative to the lateral CAM cell 26b of FIG. 5C. The lateral CAM cell 26b' includes a first data RAM cell (RAM 1) and a second data RAM cell (RAM 2). Writing to the lateral CAM cell 26b' of FIG. 5E includes driving a first pair of bit lines B1 and B1B with a rail-to-rail signal and also driving a second pair of bit lines B2 and B2B with a rail-to-rail signal. Four possible combinations of bit line signals are possible during a write operation when WL=1:

| CAM cell | RAM 1 cell | RAM 2 cell | B1/B1B | B2/B2B |
|---|---|---|---|---|
| 0 | 0 | 1 | 0/1 | 1/0 |
| N/A | 1 | 1 | 1/0 | 1/0 |
| X | 0 | 0 | 0/1 | 0/1 |
| 1 | 1 | 0 | 1/0 | 0/1 |

During a search operation, the illustrated match line ML and pseudo-ground line PGND are both precharged high and the voltages on the bit/data lines B2/D and B1/DB are at least partially or substantially equilibrated by turning on an equalization transistor 34 and transferring charge (in the form of displacement current) from D to DB or vice versa. After the voltages on the bit/data lines B2/D and B1/DB have been equilibrated to at least some degree, a respective bit of a comparand (i.e., search word) is driven onto the bit/data lines B2/D and B1/DB as a differential signal (e.g., D=1, DB=0 or D=0, DB=1). This driving of the bit/data lines B2/D and B1/DB with a bit of a comparand is performed by the column control circuit 22. An operation to compare the value of the bit of the comparand driven onto the bit/data lines B2/D and B1/DB with the value of the data stored within the lateral CAM cell 26b' can then be initiated by pulling the pseudo-ground line PGND low from a precharge high level. In this manner, the compare circuit within the CAM cell 26b' (shown as 4 transistors) can be enabled, and the match line ML can be pulled low from its precharged high level if a miss condition is present. In the event the bit/data lines B2/D and B1/DB are both held low during a search operation, the CAM cell 26b' (and all other CAM cells in the same column) will be globally masked.

The preferred operations described above will now be more fully illustrated by FIG. 6. In particular, FIG. 6 illustrates the state of a preferred 14×14 binary CAM array 36 undergoing a search operation. During the search operation, a disabled column, shown as column 7, is globally masked and row 7 is highlighted as a matching entry. The CAM cells in the disabled column are also loaded with a same data value (shown as 0). The column control circuitry is programmed to preserve the illustrated data values within the disabled CAM cells every time the CAM array 36 is reloaded with new entries. Such reloading operations may occur in response to a power reset event.

Figure 7A:
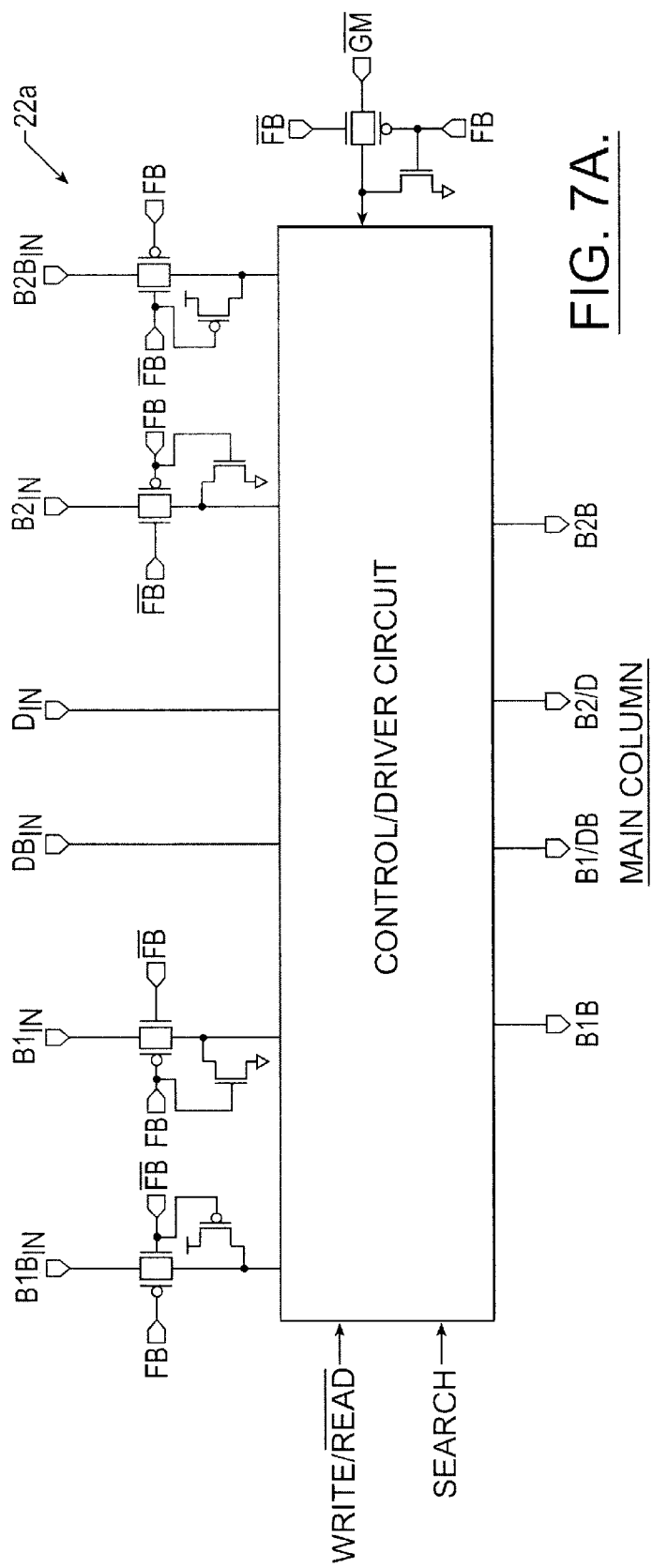
FIG. 7A is a main column control and driver circuit according to an embodiment of the present invention.
Figure 7B:
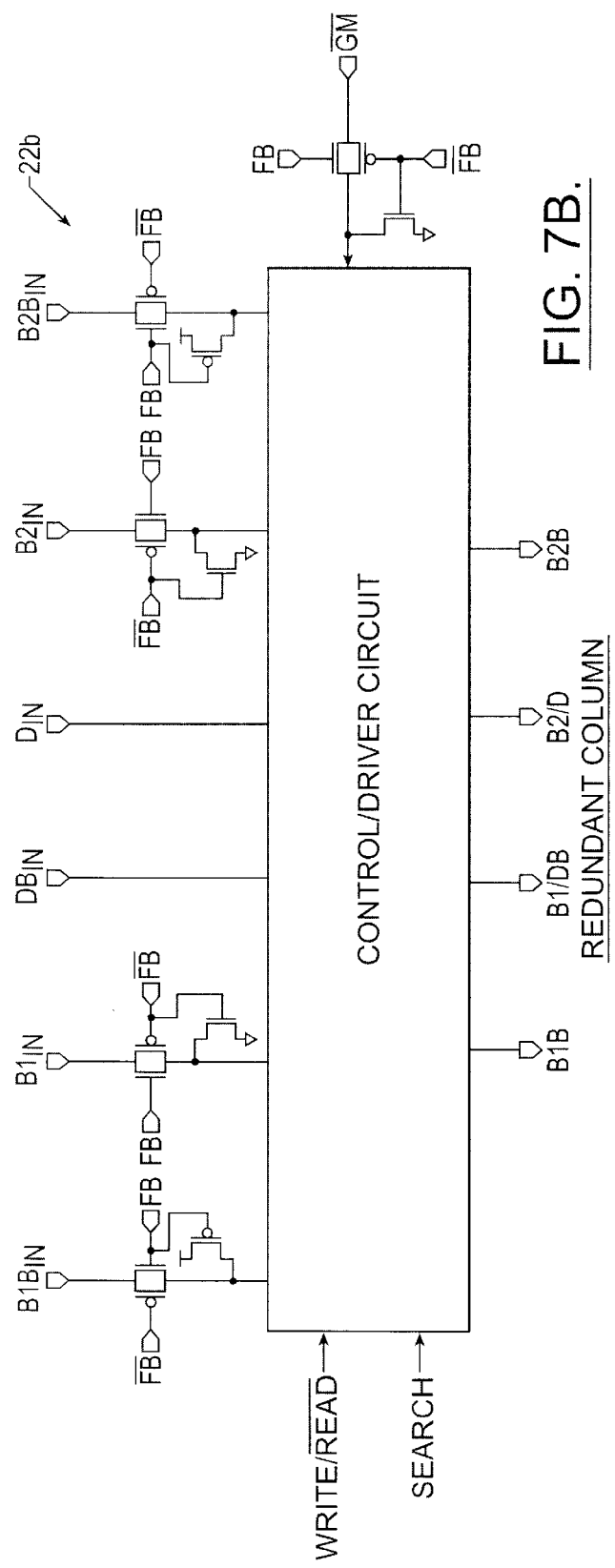
FIG. 7B is a redundant column control and driver circuit according to an embodiment of the present invention.

Referring now to FIGS. 7A–7B, preferred bit/data line control and driver circuits 22a and 22b will be described. In particular, FIG. 7A illustrates a main bit/data line control and driver circuit 22a and FIG. 7B illustrates a redundant bit/data line control and driver circuit 22b. These driver circuits 22a and 22b may be coupled to the CAM array 26a' of FIG. 5D. As illustrated by FIG. 7A, in a default condition when a respective fuse is present (i.e., FB=0), data provided on input bit and data lines (B1B$_{IN}$, B1$_{IN}$, DB$_{IN}$, D$_{IN}$, B2$_{IN}$, B2B$_{IN}$ is passed to the corresponding bit and data lines of a main column of a corresponding CAM array, as discussed above. However, if the fuse is cut, thereby rendering the main column disabled, then the inputs B1B$_{IN}$ and B2B$_{IN}$ are clamped high and B1$_{IN}$ and B2$_{IN}$ are clamped low by the illustrated pull-up and pull-down transistors. The output signal lines B1B, B1/D, B2/DB and B2B will be set accordingly to 1, 0, 0, 1, respectively, to match the clamped inputs for each valid combination of the illustrated control inputs WRITE (/READ) and SEARCH (i.e., WRITE=0, SEARCH=0 (READ), WRITE=1, SEARCH=0 (WRITE) and WRITE=0, SEARCH=1 (SEARCH)).

In contrast, with respect to the redundant bit/data line control and driver circuit 22b, the default condition is opposite to the default condition of the main bit/data line control and driver circuit 22a. In particular, if the fuse is not cut, then the redundant column remains disabled and the inputs B1B$_{IN}$ and B2B$_{IN}$ are clamped high and B1$_{IN}$ and B2$_{IN}$ are clamped low by the illustrated pull-up and pull-down transistors. The corresponding output signal lines B1B, B1/D, B2/DB and B2B will be set accordingly to 1, 0, 0, 1, respectively, to match the clamped inputs for each valid combination of the illustrated control inputs WRITE (/READ) and SEARCH (i.e., WRITE=0, SEARCH=0 (READ), WRITE=1, SEARCH=0 (WRITE) and WRITE=0, SEARCH=1 (SEARCH)). But, if the fuse is cut, data provided on input bit and data lines (B1B$_{IN}$, B1$_{IN}$, DB$_{IN}$, D$_{IN}$, B2$_{IN}$, B2B$_{IN}$) is passed to the corresponding bit and data lines of a redundant column of the CAM array.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) device, comprising:
   a CAM array having a plurality of columns of CAM cells therein; and
   a bit line control circuit that drives at least one disabled CAM cell in a disabled one of the plurality of columns of CAM cells with a respective fixed data value whenever the at least one disabled CAM cell undergoes a write operation.

2. The CAM device of claim 1, wherein the at least one disabled CAM cell comprises a data RAM cell and a mask RAM cell therein; wherein said bit line control circuit drives the mask RAM cell with a respective fixed mask value whenever the mask RAM cell undergoes a write operation; and wherein the fixed data value and the fixed mask value are established using rail-to-rail voltages.

3. The CAM device of claim 1, wherein the at least one disabled CAM cell comprises first and second RAM cells therein; and wherein said bit line control circuit drives the first RAM cell with a respective fixed data value whenever the first RAM cell undergoes a write operation and drives the second RAM cell with a respective fixed data value whenever the second RAM cell undergoes a write operation.

4. The CAM device of claim 3, wherein the first RAM cell is an SRAM cell, a DRAM cell or a nonvolatile RAM cell.

5. The CAM device of claim 1, wherein said bit line control circuit drives all disabled CAM cells in the disabled column with the same fixed data value whenever one of the disabled CAM cells undergoes a write operation.

6. The CAM device of claim 1, wherein said bit line control circuit masks all disabled CAM cells within the disabled column whenever said CAM array undergoes a search operation.

7. A content addressable memory (CAM) device, comprising:
   a CAM array having a plurality of main columns of CAM cells and at least one redundant column of CAM cells therein; and
   a bit line control circuit that is programmed to preserve data values of column disabled CAM cells across a power reset event so that each column disabled CAM cell associated with a row containing a valid entry prior to the power reset event is rewritten again with a same data value it had prior to the power reset event as its respective row is updated with a valid entry following the power reset event.

8. The CAM device of claim 7, wherein the column disabled CAM cells are volatile CAM cells having mask RAM cells therein; and wherein said bit line control circuit is programmed to preserve mask values of the column disabled CAM cells across the power reset event.

9. A content addressable memory (CAM) device, comprising:
   a CAM array having a disabled column of volatile CAM cells therein; and
   a bit line control circuit that is electrically coupled to said CAM array and is programmed to preserve data and/or mask values of disabled volatile CAM cells in the disabled column across repeated power reset events.

10. The CAM device of claim 9, wherein each of a plurality of the volatile CAM cells in the disabled column comprises a first data RAM cell and a second data/mask RAM cell therein that share a respective word line.

11. The CAM device of claim 10, further comprising an equalization transistor having a first current carrying terminal electrically coupled to one input of the first data RAM cell and a second current carrying terminal electrically coupled to one input of the second data/mask RAM cell.

12. A content addressable memory (CAM) device, comprising:
   a CAM array having a plurality of main columns of CAM cells and at least one redundant column of CAM cells therein; and
   a bit line control circuit that is fuse-programmed to drive at least one CAM cell in a defective one of said plurality of main columns of CAM cells with a respective fixed data value whenever the at least one CAM cell undergoes a write operation and to mask the defective one of said plurality of main columns of CAM cells whenever said CAM array undergoes a search operation.

13. The CAM device of claim 12, wherein said bit line control circuit is fuse-programmed to drive each CAM cell in the defective one of said plurality of main columns of CAM cells with a respective fixed data value whenever the respective CAM cell undergoes a write operation.

14. A content addressable memory (CAM) device, comprising:
   a CAM array having a plurality of columns of CAM cells therein; and
   a bit line control circuit that is programmed to drive a disabled column of CAM cells with a same data value whenever a row of said CAM array is written to.

15. A content addressable memory (CAM) device, comprising:
   a CAM array having a plurality of main columns of CAM cells and at least one redundant column of CAM cells therein; and
   a bit line control circuit that is fuse-programmed to drive each CAM cell in a unused redundant column of CAM cells with a respective fixed data value whenever the respective CAM cell is written to.

16. A content addressable memory (CAM) device, comprising:
   a CAM array having an inactive redundant column of volatile CAM cells therein; and
   a bit line control circuit that is electrically coupled to said CAM array and is programmed to preserve intentionally written data and/or mask values of the volatile CAM cells in the inactive redundant column across repeated power reset events.

17. The CAM device of claim 16, wherein at least one of the volatile CAM cells comprises a first data RAM cell and a second data/mask RAM cell therein that share a respective word line.

18. The CAM device of claim 17, wherein the first data RAM cell is electrically coupled to said bit line control circuit by a first pair of differential bit lines; and wherein the second data/mask RAM cell is electrically coupled to said bit line control circuit by a second pair of differential bit lines that run parallel to the first pair of differential bit lines.

19. The CAM device of claim 18, further comprising an equalization transistor having a first current carrying terminal electrically coupled to one of the first pair of differential bit lines and a second current carrying terminal electrically coupled to one of the second pair of differential bit lines.

20. A content addressable memory (CAM) device, comprising:
   a CAM array having a plurality of main columns of CAM cells and at least one redundant column of CAM cells therein; and
   control circuitry that is fuse-programmed to write a plurality of disabled CAM cells within a defective one of said plurality of main columns of CAM cells with a same fixed data value so that each of the plurality of disabled CAM cells can be reliably masked whenever said CAM array is searched.

21. A content addressable memory (CAM) device, comprising:
   a CAM array having a plurality of main columns of CAM cells and at least one redundant column of CAM cells therein; and
   a bit line control circuit electrically coupled by bit and/or data lines to said CAM array, said bit line control circuit comprising one or more programmable circuit elements therein that cause said bit line control circuit to recognize the at least one redundant column of CAM cells as a replacement for one of said plurality of main columns of CAM cells and, upon recognition, to drive each of a first plurality of CAM cells in a defective one of said plurality of main columns of CAM cells with a same fixed data value each and every time a CAM cell in the first plurality undergoes a write operation.

22. A content addressable memory (CAM) device, comprising:
   a CAM array; and
   a bit/data line control circuit that is programmed to replace a defective column of CAM cells in said CAM array with another column of CAM cells in said CAM array and, upon replacement, to drive the defective column of CAM cells with fixed write data during write operations so that, consistent with post-manufacture yield testing, CAM cells within the defective column are precluded from contributing to either sustained or intermittent look-up errors caused when one or more defective transistors within the defective column of CAM cells prevent successful masking of the defective column during an operation to compare valid entries in said CAM array with a search word applied to said programmable bit/data line control circuit.

23. A method of operating a content addressable memory (CAM) device having a CAM array therein and a bit/data line control circuit electrically coupled to normal and redundant columns of CAM cells in the CAM array, said method comprising the step of:
   programming the bit/data line control circuit to drive a respective fixed data value into at least a first plurality of disabled cells within a defective normal column of CAM cells when rows containing these first plurality of disabled cells are written with valid entries, so that at commencement of each search operation occurring while the CAM array is at least partially full of the valid entries, each and every one of the first plurality of disabled cells being masked retains its respective fixed data value.

24. A method of operating a content addressable memory (CAM) device having a CAM array therein and a column control circuit electrically coupled to the CAM array, said method comprising the steps of:
   programming the column control circuit to: (i) activate a redundant column of CAM cells within the CAM array, (ii) disable a defective column of CAM cells within the CAM array, and (iii) preserve data and/or mask values of volatile CAM cells in the defective column across repeated power reset events.

25. A content addressable memory (CAM) device, comprising:
- a CAM array; and
- a column control circuit that is programmed to reboot an unused redundant column of volatile CAM cells within said CAM array upon power-up in a manner that preserves the data values written into each of the volatile CAM cells within the unused redundant column prior to the power-up.

26. The CAM device of claim 25, wherein the data values written into each of the volatile CAM cells in the unused redundant column are preserved on a row-by-row basis as valid entries are sequentially written into said CAM array following power-up.

27. A content addressable memory (CAM) device, comprising:
- a CAM array having a plurality of main columns of CAM cells and a disabled redundant column of CAM cells therein; and
- a bit line control circuit that is programmed to preserve data values of redundant CAM cells in the redundant column across a power reset event so that each disabled redundant CAM cell residing in a row containing a valid entry prior to the power reset event is rewritten again with a same data value it had prior to the power reset event as its respective row is updated with a new valid entry following the power reset event.

28. A content addressable memory (CAM) device, comprising:
- a CAM array; and
- control circuitry that is programmed to reboot a disabled column of volatile CAM cells within said CAM array upon power-up in a manner that preserves the data values written into each of the volatile CAM cells within the disabled column prior to the power-up.

29. A content addressable memory (CAM) device, comprising:
- a CAM array having a disabled column of CAM cells therein; and
- control circuitry that writes a first data value into a first CAM cell in the disabled column each and every time a row containing the first CAM cell is written with an entry.

30. The CAM device of claim 29, wherein the first data value is programmed to remain the same across repeated power reset events.

31. A method of operating a content addressable memory (CAM) device, comprising the steps of:
- loading a first data value and second data/mask value into a CAM cell comprising first and second RAM cells that share a respective word line and are separated by compare logic that is electrically connected to an output of the first RAM cell and an output of the second RAM cell;
- precharging a match line and a pseudo-ground line that are electrically coupled to the compare logic;
- enabling an equalization transistor having a first current carrying terminal electrically coupled to a true input of the compare logic and a second current carrying terminal electrically coupled to a differential input of the compare logic, to thereby transfer charge between a true data line that is electrically coupled to an input of the first RAM cell and a complementary data line that is electrically coupled to an input of the second RAM cell for a duration sufficient to substantially equilibrate a potential of the true data line with a potential of the complementary data line; then
- driving the true and complementary data lines with a respective bit of a comparand while the equalization transistor is disabled; and then
- comparing a state of the CAM cell with the bit of the comparand to detect a match therebetween, in response to pulling the pseudo-ground line low from a precharged level.

32. A content addressable memory (CAM) device, comprising:
- a CAM array having a plurality of disabled CAM cells therein that span a disabled column, with each of the disabled CAM cells in the plurality comprising a first data RAM cell and a second data/mask RAM cell that share a respective word line and are separated by respective compare logic; and
- control circuitry that writes a first data value into a first disabled CAM cell in the disabled column whenever a row containing the first disabled CAM cell is written with a new entry.

33. The CAM device of claim 32, wherein the first data value is programmed to remain the same across repeated power reset events.

34. The CAM device of claim 33, wherein the first data RAM cell is electrically coupled to a first pair of differential bit lines and the second data/mask RAM cell is electrically coupled to a second pair of differential bit lines.

35. The CAM device of claim 34, wherein the compare logic has a true data input that is electrically coupled to a complementary one of the first pair of differential bit lines and a complementary data input that is electrically coupled to a true one of the second pair of differential bit lines.

36. The CAM device of claim 35, further comprising an equalization transistor having first and second current carrying terminals electrically coupled to the complementary one of the first pair of differential bit lines and the true one of the second pair of differential bit lines, respectively.

37. The CAM device of claim 32, further comprising an equalization transistor that is electrically coupled across a pair of differential data lines associated with the disabled column.

38. A method of operating a content addressable memory (CAM) device, comprising the steps of:
- writing a first data value and second data/mask value into a CAM cell comprising first and second RAM cells that share a respective word line and are separated by compare logic having true and complementary data inputs that are electrically coupled to true and complementary data lines, respectively;
- precharging a match line and a pseudo-ground line that are electrically coupled to the compare logic;
- at least partially equilibrating a potential of the true data line with a potential of the complementary data line by transferring charge therebetween and then driving the true and complementary data lines rail-to-rail with a bit of a comparand; and then
- comparing a state of the CAM cell with the bit of the comparand to detect a match therebetween, in response to pulling the precharged pseudo-ground line low.

39. The method of claim 38, wherein said equilibrating step comprises transferring charge from a more positively biased one of the true and complementary data lines to a less positively biased one of the true and complementary data lines for a duration sufficient to achieve a potential difference between the true and complementary data lines that is less than about 30% of a rail-to-rail voltage.

40. A content addressable memory (CAM) device, comprising:
- a CAM array having a plurality of columns of CAM cells therein;
- a bit line control circuit that is programmed to drive a disabled column of CAM cells with a same data value whenever a CAM cell in the disabled column is written to; and
- an equalization transistor electrically coupled across a pair of differential data lines associated with the disabled column.

41. A method of operating a content addressable memory (CAM) device, comprising the steps of:
- writing a first data value and first data/mask value into a disabled column CAM cell having first and second RAM cells therein that share a first word line by simultaneously driving a first pair of bit lines connected to the first RAM cell with opposite rail voltages and a second pair of bit lines connected to the second RAM cell with opposite rail voltages, while the first word line is active;
- writing a second data value and second data/mask value into an active column CAM cell having third and fourth RAM cells therein that share the first word line by simultaneously driving a third pair of bit lines connected to the third RAM cell with opposite rail voltages and a fourth pair of bit lines connected to the fourth RAM cell with opposite rail voltages, while the first word line is active;
- precharging a match line that is electrically coupled to the disabled column CAM cell and the active column CAM cell;
- at least partially equilibrating a potential of a true data line that is electrically coupled to the active column CAM cell with a potential of a complementary data line that is electrically coupled to the active column CAM cell by transferring charge therebetween and then driving the true and complementary data lines with opposite rail-to-rail voltages that represent a respective bit of a comparand; and then
- comparing the bit of the comparand with the second data value and second data/mask value stored in the active column CAM cell while simultaneously masking the disabled column CAM cell.

42. The method of claim 41, wherein the active column CAM cell comprises a compare circuit that extends between the third and fourth RAM cells; and wherein a true input of the compare circuit is electrically connected to one of the third pair of bit lines and a complementary input of the compare circuit is electrically connected to one of the fourth pair of bit lines.

43. The method of claim 41, wherein said equilibrating step comprises turning on an equalization transistor having a first current carrying terminal electrically connected to one of the third pair of bit lines and a second current carrying terminal electrically connected to one of the fourth pair of bit lines.

44. A method of operating a content addressable memory (CAM) device, comprising the step of:
- rebooting a disabled column of volatile CAM cells within a CAM array in response to a power reset event by writing entries into the CAM array in a manner that preserves identical data and/or mask values written into each of the volatile CAM cells within the disabled column prior to the power reset event.

45. A content addressable memory (CAM) device, comprising:
- a CAM array having a disabled CAM cell therein that comprises a first RAM cell and a second RAM cell that share a respective word line;
- a first pair of differential bit lines electrically connected to the first RAM cell and a second pair of differential bit lines electrically connected to the second RAM cell; and
- a bit/data line control circuit that is fuse-programmed to clamp a first one of the first pair of differential bit lines and a first one of the second pair of differential bit lines at a first voltage level when said CAM array undergoes reading, writing and search operations.

46. The CAM device of claim 45, wherein said bit/data line control circuit is fuse-programmed to clamp a second one of the first pair of differential bit lines and a second one of the second pair of differential bit lines at a second voltage level when said CAM array undergoes reading, writing and search operations.

47. The CAM device of claim 46, wherein the first voltage level is about Vss and the second voltage level is about Vdd.

48. The CAM device of claim 46, further comprising an equalization transistor having a first current carrying terminal electrically coupled to the first one of the first pair of differential bit lines and a second current carrying terminal electrically coupled to the first one of the second pair of differential bit lines.

* * * * *